(12) United States Patent
Abe et al.

(10) Patent No.: US 10,370,769 B2
(45) Date of Patent: Aug. 6, 2019

(54) METHOD OF MANUFACTURING ELECTROFORMED COMPONENTS

(71) Applicant: CITIZEN WATCH CO., LTD., Nishitokyo-shi, Tokyo (JP)

(72) Inventors: Yosuke Abe, Fuchu (JP); Tomoo Ikeda, Shiraoka (JP); Ryoichi Shima, Higashikurume (JP); Yoshiki Ono, Itabashi (JP); Taku Asami, Tokorozawa (JP); Yosuke Sasaki, Tokorozawa (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/533,694

(22) PCT Filed: Dec. 11, 2015

(86) PCT No.: PCT/JP2015/084841
§ 371 (c)(1),
(2) Date: Jun. 7, 2017

(87) PCT Pub. No.: WO2016/093355
PCT Pub. Date: Jun. 16, 2016

(65) Prior Publication Data
US 2017/0362728 A1 Dec. 21, 2017

(30) Foreign Application Priority Data
Dec. 12, 2014 (JP) ................................. 2014-251860

(51) Int. Cl.
*C25D 1/22* (2006.01)
*C25D 1/08* (2006.01)
(Continued)

(52) U.S. Cl.
CPC ............... *C25D 1/08* (2013.01); *C25D 1/003* (2013.01); *C25D 1/20* (2013.01); *C25D 1/22* (2013.01);
(Continued)

(58) Field of Classification Search
None
See application file for complete search history.

(56) References Cited

U.S. PATENT DOCUMENTS 4,088,544 A * 5/1978 Hutkin ..................... C25D 1/04
204/281
5,255,017 A * 10/1993 Lam .......................... B41J 2/162
205/75
(Continued)

FOREIGN PATENT DOCUMENTS

| CH | 704086 A2 | 5/2012 |
|---|---|---|
| EP | 2 157 476 A1 | 2/2010 |

(Continued)

OTHER PUBLICATIONS

English Translation of EP 2405300 (Year: 2012).*
(Continued)

*Primary Examiner* — Stefanie S Wittenberg
(74) *Attorney, Agent, or Firm* — Foley & Lardner LLP

(57) ABSTRACT

In manufacturing of a first electroformed component and a second electroformed component having portions fitted to each other into close contact, after the first electroformed component is formed, the first electroformed component is used as a portion of an electroforming mold to form the second electroformed component. Using the first electroformed component as a portion of the electroforming mold to form the second electroformed component, the shape of the first electroformed component is transferred to the second electroformed component. As a result, multiple types of components differing in shape may be accurately manufactured concurrently in a series of manufacturing steps.

6 Claims, 23 Drawing Sheets

(51) Int. Cl.
  *G04B 15/14* (2006.01)
  *C25D 1/00* (2006.01)
  *C25D 1/20* (2006.01)
  *G03F 7/09* (2006.01)
  *G03F 7/095* (2006.01)
  *H01L 21/288* (2006.01)
  *G04B 13/02* (2006.01)
  *G04B 17/06* (2006.01)
  *G03F 7/00* (2006.01)
  *G03F 7/40* (2006.01)
  *G04D 3/00* (2006.01)

(52) U.S. Cl.
  CPC ............ *G03F 7/0035* (2013.01); *G03F 7/094* (2013.01); *G03F 7/095* (2013.01); *G03F 7/40* (2013.01); *G04B 13/02* (2013.01); *G04B 15/14* (2013.01); *G04B 17/066* (2013.01); *H01L 21/2885* (2013.01); *G04D 3/0069* (2013.01)

(56) References Cited

U.S. PATENT DOCUMENTS

| | | | |
|---|---|---|---|
| 5,277,783 A | 1/1994 | Ohashi et al. | |
| 6,174,416 B1* | 1/2001 | Magenau | C25D 5/022 204/192.12 |
| 2004/0146650 A1* | 7/2004 | Lockard | C23C 4/02 427/307 |
| 2011/0146070 A1 | 6/2011 | Fiaccabrino et al. | |
| 2011/0203934 A1 | 8/2011 | Rey-Mermet | |
| 2011/0233063 A1* | 9/2011 | Seki | C25D 5/022 205/70 |
| 2012/0042510 A1* | 2/2012 | Fussinger | B81C 99/0085 29/829 |

FOREIGN PATENT DOCUMENTS

| | | | | |
|---|---|---|---|---|
| EP | 1916567 B1 | | 4/2010 | |
| EP | 2405300 | * | 1/2012 | ............ B81C 1/00 |
| EP | 2833204 | * | 2/2015 | ............ B81C 99/00 |
| JP | 8-176757 A | | 7/1996 | |
| JP | 11-323592 | * | 11/1999 | ............ C25D 1/10 |
| JP | 2005-180940 A | | 7/2005 | |
| JP | 2008-126375 A | | 6/2008 | |
| JP | 2010-247500 A | | 11/2010 | |
| JP | 2011-89169 A | | 5/2011 | |
| JP | 2012-506954 A | | 3/2012 | |
| JP | 2012-189491 A | | 10/2012 | |

OTHER PUBLICATIONS

Chinese Office Action and English translation, Application No. 201580066377.X, dated May 28, 2018, 15 pages.

Extended European Search Report, dated Jul. 19, 2018, 6 pages.

* cited by examiner

METHOD OF MANUFACTURING ELECTROFORMED COMPONENTS

TECHNICAL FIELD

The present invention relates to a method of manufacturing electroformed components, used in manufacturing precision fine components used in precision equipment, etc.

BACKGROUND ART

Electroforming is a type of electroplating technique and enables manufacturing (replication) of a metal product (electroformed component) having a shape and surface irregularities of a model reproduced by electrodepositing electrolyzed metal and ions on a surface of the model. In such electroforming, a component with a high transfer property may be manufactured using an electroforming mold processed with precision. The manufacture a precision component of a timepiece, etc. using an electroforming mold manufactured by photolithography using a photosensitive material as in a silicon process with a lithographie galvanoformung abformung (LIGA) technique has been proposed recently.

For example, in a conventional technique, an opening pattern is formed using photoresist on a substrate conductive on one surface and, after a step of forming a metal layer by electroforming in the opening is executed twice, the substrate and the lower metal layer are removed to obtain an electroformed body having an uneven surface differing in surface form according to the upper metal layer (see, for example, Patent Document 1).

In another conventional technique, for example, by repeating a step of forming a metal constituent component layer by electroforming on a resin mold formed by lithography on a conductive substrate and then planarizing the layer by polishing or grinding multiple times, a stepped three-dimensional fine structure is manufactured (see, for example, Patent Document 2).

Patent Document 1: Japanese Laid-Open Patent Publication No. 2011-89169

Patent Document 2: Japanese Laid-Open Patent Publication No. 2008-126375

DISCLOSURE OF INVENTION

Problem to Be Solved By the Invention

However, although the conventional methods of manufacturing electroformed components such as electroformed bodies and fine structures by electroforming (hereinafter referred to as "electroformed components") enable manufacturing of components having an uneven surface or multilevel-shaped electroformed components through a series of manufacturing steps as described above, only one type of electroformed components may be manufactured.

Therefore, when multiple types of components are manufactured by electroforming, respective electroformed components must be manufactured by different manufacturing steps. Thus, the conventional methods of manufacturing electroformed components described above have a problem of poor manufacturing efficiency. Particularly when multiple types of electroformed components to be manufactured are components partially having stepped portions (stepped components), the number of steps required for manufacturing the stepped components increases, and the electroformed components requiring the increased number of steps must be manufactured by manufacturing steps different from those of another type of electroformed components. Thus, the methods have a problem of poor manufacturing efficiency.

Moreover, the conventional methods of manufacturing electroformed components described above have a problem in that since respective electroformed components are manufactured by different manufacturing steps, when multiple types of electroformed components to be manufactured are electroformed components that are to move relative to each other while partially in close contact with or abutting each other, it is difficult to ensure manufacturing accuracy in the portions that are to abut each other.

To solve the problems of the conventional techniques described above, it is an object of the present invention to provide a method of manufacturing electroformed components, enabling accurate manufacturing of multiple types of components having different shapes, concurrently in a series of manufacturing steps.

Additionally, to solve the problems of the conventional techniques described above, it is an object of the present invention to provide a method of manufacturing electroformed components, enabling accurate manufacturing of multiple types of components concurrently in a series of manufacturing steps, the components having different shapes and at least partially in close contact with or abutting each other.

Furthermore, to solve the problems of the conventional techniques described above, it is an object of the present invention to provide a method of manufacturing electroformed components, enabling accurate manufacturing of multiple types of components concurrently in a series of manufacturing steps, the components having different shapes and moving relative to each other while at least partially in close contact with or abutting each other.

Means for Solving Problem

To solve the problems above and achieve an object, according to the present invention, a method of manufacturing electroformed components, includes forming a first through-hole by patterning a first photoresist layer formed on a front surface side of a conductive layer, the first through-hole penetrating the first photoresist layer along a stacking direction of the conductive layer and the first photoresist layer; depositing a first electroformed member on the front surface side of the conductive layer in the first through-hole by electroforming using the conductive layer as one electrode; forming a first electroformed component by planarizing the front surface side of the first electroformed member and the first photoresist layer; removing the first photoresist layer from the conductive layer having the first electroformed component formed; forming a film for separation on a surface of the first electroformed component exposed by removing the first photoresist layer; forming a second through-hole by forming on the front surface side of the conductive layer, a second photoresist layer covering the first electroformed component from the front surface side and by patterning the second photoresist layer, the second through-hole penetrating the second photoresist layer along the stacking direction while a portion of the first electroformed component projects inward; depositing a second electroformed member on the front surface side of the conductive layer in the second through-hole by electroforming using the conductive layer as one electrode; forming a second electroformed component by planarizing the front surface side of the second electroformed member and the second photoresist layer; removing the conductive layer from the first electroformed component, the second electroformed component, and the second photoresist layer; and removing the second photoresist layer from the first electroformed component and the second electroformed component having the conductive layer removed.

The method further includes chamfering the first electroformed component at least on a corner of a portion located in the second through-hole, where the forming of the film for separation is executed after the chamfering. In the method, the chamfering includes chamfering the corner by one of electrolytic polishing and wet etching.

In the method, the conductive layer is formed on a surface of a substrate containing one of an insulating material and a semiconductive material.

In the method, the forming of the film for separation includes forming a surface oxide film as the film for separation.

In the method, the first electroformed component and the second electroformed component are components at least partially in close contact with or abutting each other.

In the method, the first electroformed component and the second electroformed component are components that move relative to each other while at least partially in close contact with or abutting each other.

In the method, the forming of the first electroformed component includes planarizing the first electroformed member and the first photoresist layer by grinding from the front surface side.

In the method, the forming of the second electroformed component includes planarizing the second electroformed member and the second photoresist layer by grinding from the front surface side.

EFFECT OF THE INVENTION

The method of manufacturing electroformed components according to the present invention achieves an effect in that multiple types of components having different shapes may be accurately manufactured concurrently in a series of manufacturing steps.

Additionally, the method of manufacturing electroformed components according to the present invention achieves an effect in that multiple types of components having different shapes and at least partially in close contact with or abutting each other may be accurately manufactured concurrently in a series of manufacturing steps.

Furthermore, the method of manufacturing electroformed components according to the present invention achieves an effect in that multiple types of components having different shapes and moving relative to each other while at least partially in close contact with or abutting each other may be accurately manufactured concurrently in a series of manufacturing steps.

BEST MODE(S) FOR CARRYING OUT THE INVENTION

Figure 1:
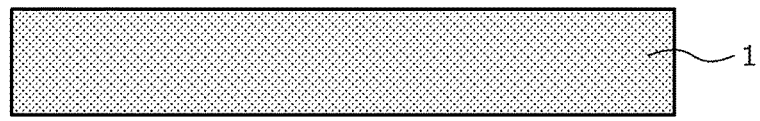
FIG. 1 is an explanatory view (part 1) of a procedure of manufacturing electroformed components according to a method of manufacturing electroformed components of a first embodiment according to the present invention.

Embodiments of a method of manufacturing electroformed components according to the present invention will be described in detail with reference to the accompanying drawings.

<First Embodiment>

In a first embodiment, a method of manufacturing electroformed components achieved by application of a lithographie, galvanoformung, abformung (LIGA) method will be described as a method of manufacturing electroformed components of a first embodiment according to the present invention. The LIGA method is a method of manufacturing a target part (structure) by combining X-ray lithography, electroforming, and molding, and is capable of manufacturing a component having a large aspect ratio (ratio of depth (height) to processing width).

When an electroformed component is manufactured using the LIGA method, a resist (photosensitive organic material) having a thickness of 100 μm or more is exposed to X-rays through a mask (X-ray mask) to transfer a pattern of the mask to the resist. This enables manufacturing of a component having a depth (height) of 100 μm or more and an arbitrary shape in a lateral direction (direction along a surface of a substrate). Preferably, the X-rays to be used are, for example, X-rays generated from a synchrotron radiation (SR) optical device with favorable linearity.

For example, the method of manufacturing electroformed components of the first embodiment may be used for manufacturing electroformed components (a first electroformed component and a second electroformed component) fitted to or engaged with each other in a product formed by assembling the electroformed components. For example, such electroformed components may be achieved by a shaft and a bearing, or gears constituting a train wheel. The electroformed components (the first electroformed component and the second electroformed component) fitted to each other may be fitted to rotate or slide relative to each other.

In particular, according to the method of manufacturing electroformed components of the first embodiment, the electroformed components fitted to each other may include the first electroformed component that is a bearing into which a shaft is fitted and the second electroformed component that is the shaft fitted into the bearing. In particular, according to the method of manufacturing electroformed components of the first embodiment, the first electroformed component and the second electroformed component engaged with each other may be achieved by gears constituting a wheel train.

(Procedure of Manufacturing Electroformed Components)

First, the method of manufacturing electroformed components of the first embodiment according to the present invention will be described. FIGS. 1, 2, 3, 4, 6, 7, 8, 9, 10, 11, 12, and 13 are explanatory views of a procedure of manufacturing electroformed components according to the method of manufacturing electroformed components of the first embodiment according to the present invention. FIG. 5 is an explanatory view of an arrangement state in an electroforming tank. FIGS. 1 to 4 and 6 to 13 schematically depict cross-sections of electroformed components at steps of manufacturing electroformed components according to the method of manufacturing electroformed components of the first embodiment. FIG. 5 schematically depicts an arrangement state in the electroforming tank at a step according to the method of manufacturing electroformed components of the first embodiment.

In manufacturing electroformed components according to the method of manufacturing electroformed components of the first embodiment, first, as depicted in FIG. 1, a substrate 1 is prepared. The substrate 1 may be formed using an insulating material having favorable insulation properties, for example. In particular, the substrate 1 may be formed using an insulating material such as glass or plastic, for example.

Alternatively, the substrate 1 may be formed using a semiconductor material (semiconductive material) having semiconductivity, for example. In this case, for example, the substrate 1 may be formed using a semiconductor material such as silicon (Si). In the first embodiment, a silicon substrate formed using silicon is used as the substrate 1. In the following description, the silicon substrate will be denoted by reference character 1.

Figure 2:
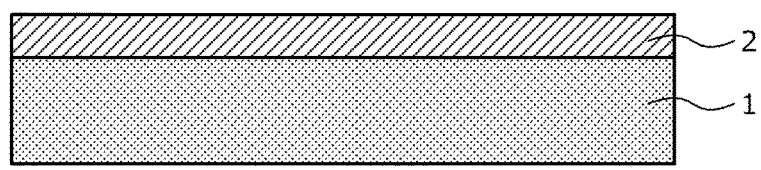
FIG. 2 is an explanatory view (part 2) of the procedure of manufacturing electroformed components according to the method of manufacturing electroformed components of the first embodiment according to the present invention.

Subsequently, as depicted in FIG. 2, a conductive layer 2 is formed on the front surface side of the silicon substrate 1. The conductive layer 2 may be formed using a material having favorable conductivity. For example, the conductive layer 2 may be formed by applying a metal material such as copper (Cu) and gold (Au) to have a uniform thickness on the front surface of the silicon substrate 1 by a method such as sputtering. In particular, the conductive layer 2 (seed metal) is formed by providing a metal material such as copper (Cu) and gold (Au) with a thickness of about 1 μm to 2 μm on the front surface side of the silicon substrate 1. The conductive layer 2 is also referred to as a seed metal.

Figure 3:
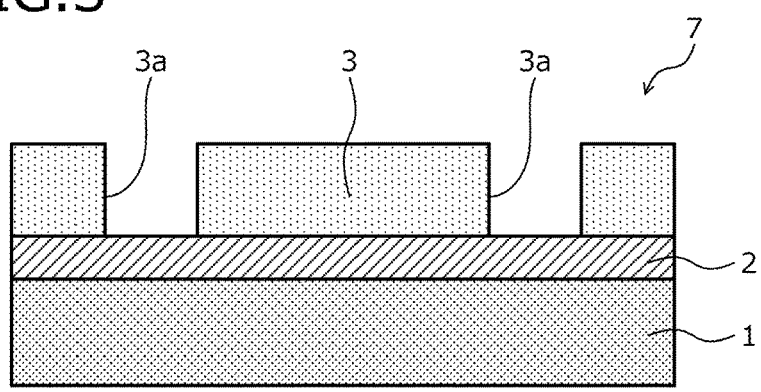
FIG. 3 is an explanatory view (part 3) of the procedure of manufacturing electroformed components according to the method of manufacturing electroformed components of the first embodiment according to the present invention.

Subsequently, as depicted in FIG. 3, a first photoresist layer 3 is formed on the front surface side of the conductive layer 2, and the first photoresist layer 3 is patterned to form an opening (first through-hole) 3a in the first photoresist layer 3. For example, the opening 3a is formed to penetrate the first photoresist layer 3 in the thickness direction. For example, if a shaft and a bearing are manufactured as electroformed components, the opening 3a is provided in a component serving as the bearing and is formed into a size (inner diameter and depth) into which the shaft may be inserted (fitted) so as to receive the shaft. A first electroforming mold 7 is achieved by the first photoresist layer 3 with the opening 3a formed and the conductive layer 2.

At the time of forming the first electroforming mold 7, for example, first, on the front surface side of the conductive layer 2, a positive type photoresist is applied to have a thickness greater than that of the first electroformed component to be manufactured, so as to form the first photoresist layer 3. The first photoresist layer 3 is applied to have a uniform thickness of several hundred pm to about 500 μm, for example.

Subsequently, a photomask shielding a portion other than the portion corresponding to the opening 3a is set on the front surface side of the first photoresist layer 3. Ultraviolet rays, X-rays, etc. are applied for exposure with the photomask set. The first photoresist layer 3 (the silicon substrate 1) is then developed using an alkali solution, etc. to remove the portion exposed to the ultraviolet rays, X-rays, etc. By such patterning, the opening 3a may be formed and the first electroforming mold 7 may be produced.

The first electroforming mold 7 is not limited to those produced using a positive type photoresist. The first electroforming mold 7 may be produced using a negative type photoresist. In the case of using a negative type photoresist for forming the first electroforming mold 7, a photomask shielding only the portion corresponding to the opening 3a is used.

Figure 4:
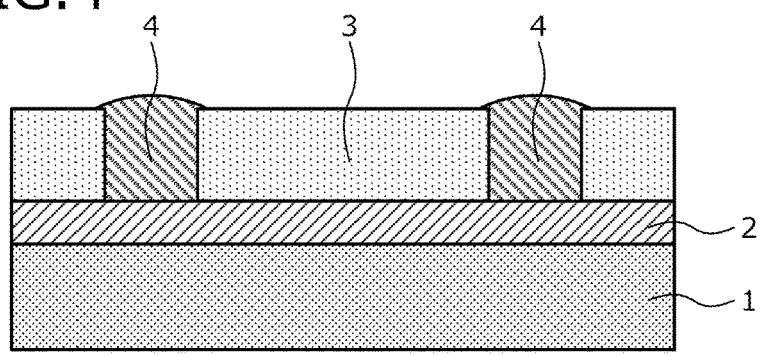
FIG. 4 is an explanatory view (part 4) of the procedure of manufacturing electroformed components according to the method of manufacturing electroformed components of the first embodiment according to the present invention.
Figure 5:
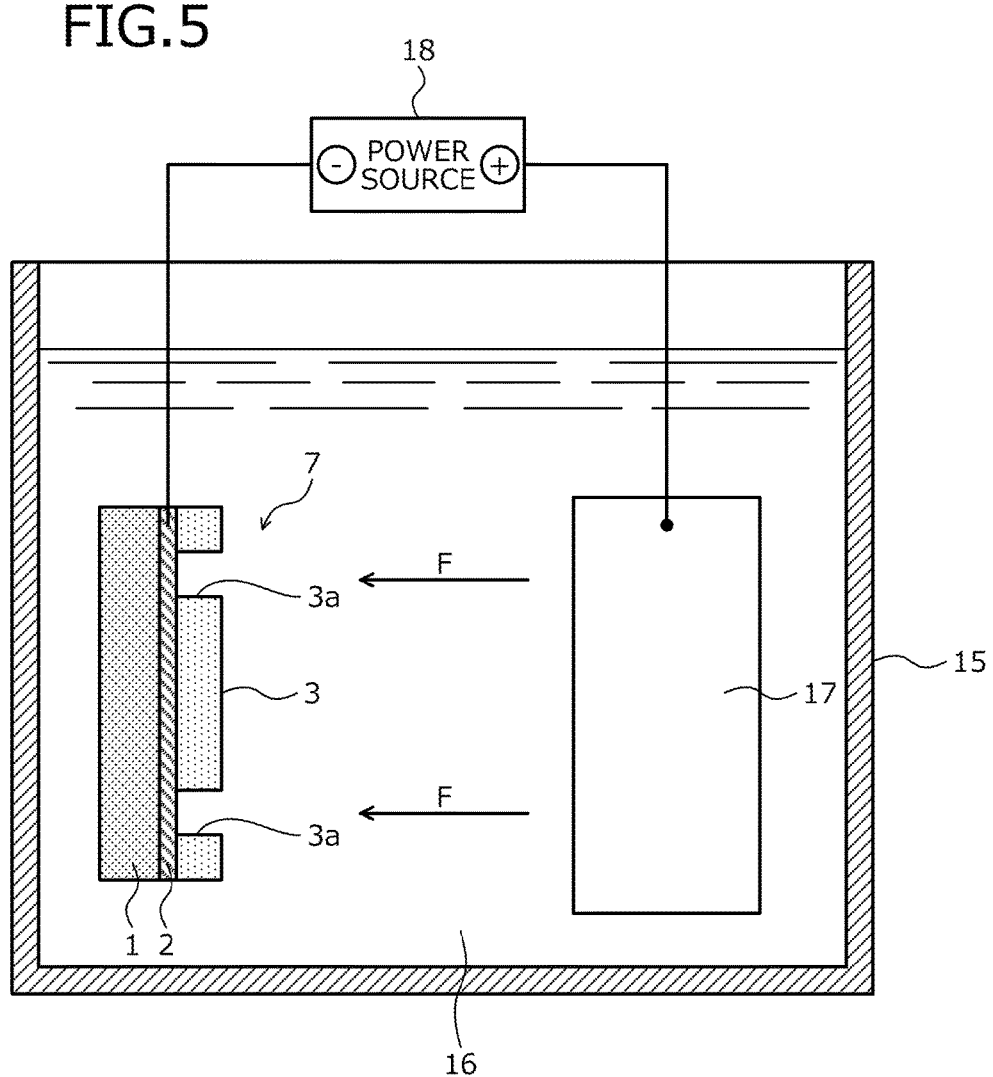
FIG. 5 is an explanatory view of an arrangement state in an electroforming tank.

Subsequently, as depicted in FIG. 4, electroforming is performed using, as one of the electrodes, the conductive layer 2 that achieves the first electroforming mold 7 and a first electroformed member 4 is deposited on the front surface side of the conductive layer 2 in the opening 3a in the first photoresist layer 3. At the time of electroforming for depositing the first electroformed member 4, an electrolytic solution 16 is filled in an electroforming tank 15 depicted in FIG. 5, and the first electroforming mold 7 depicted in FIG. 3 is immersed in a bath of the electrolytic solution 16. The first electroforming mold 7 is immersed in the bath of the electrolytic solution 16 with the first photoresist layer 3 side facing a counter electrode 17.

The counter electrode 17 is formed using the same metal material as the first electroformed member 4. For example, nickel (Ni) may be used for the counter electrode 17. An electrolytic solution used as the electrolytic solution 16 depends on the metal to be electroformed. For example, when nickel is electroformed as the first electroformed member 4, a nickel electrolytic solution is used. In particular, for the electrolytic solution 16 in the case of electroforming nickel as the first electroformed member 4, for example, an aqueous solution containing a nickel sulfamate hydrated salt is used. The electroforming material used for electroforming for depositing the first electroformed member 4 is not limited to nickel, and all materials usable for electroforming may be used, including copper (Cu), gold (Au), silver (Ag), iron (Fe), alloys containing these metals, etc.

At the time of electroforming for depositing the first electroformed member 4, subsequently, a DC voltage is applied by a power source 18 between the conductive layer 2 of the first electroforming mold 7 and the counter electrode 17 in the state of being immersed in the bath of the electrolytic solution 16. The DC voltage is applied such that the counter electrode 17 serves as a positive electrode (anode) while the conductive layer 2 serves as a negative electrode (cathode). By applying the DC voltage, metal ions electrolyzed from the counter electrode 17 in the electrolytic solution 16 migrate in a direction indicated by arrows F in FIG. 5 and are electrodeposited on the front surface side of the conductive layer 2 in the opening 3a of the first photoresist layer 3 of the first electroforming mold 7.

The electrodeposition of metal ions electrolyzed from the counter electrode 17 continues while the DC voltage is applied. As a result, the metal ions electrolyzed from the counter electrode 17 are deposited on the first electroformed member 4. The electroforming is performed until the first electroformed member 4 is formed to have such a thickness allowing the member to somewhat project and rise from the surface of the first photoresist layer 3.

Figure 6:
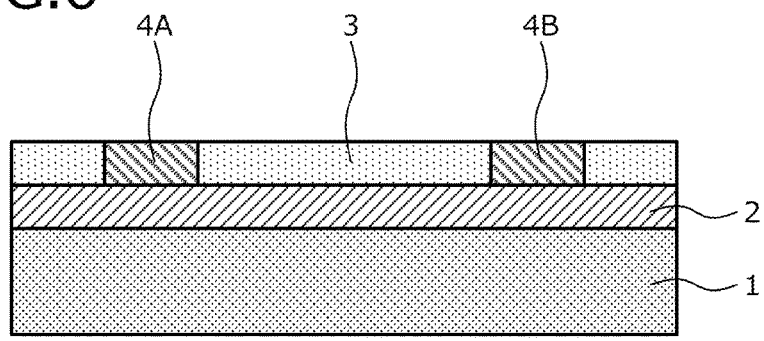
FIG. 6 is an explanatory view (part 5) of the procedure of manufacturing electroformed components according to the method of manufacturing electroformed components of the first embodiment according to the present invention.

Subsequently, as depicted in FIG. 6, the first electroformed member 4 and the first photoresist layer 3 are planarized on the front surface side to form first electroformed components 4A, 4B. For example, a portion of the front surface side of the first electroformed member 4 is ground and planarized along with the first photoresist layer 3 to form the first electroformed components 4A, 4B. The grinding at the time of planarizing the portion of the front surface side of the first electroformed member 4 and the front surface side of the first photoresist layer 3 includes "grinding" using a grinder (grindstone) and "polishing" making surface texture (surface roughness) smoother as compared to the grinding using a grindstone. The planarization of the first electroformed member 4 and the first photoresist layer 3 is performed until the first electroformed member 4 and the first photoresist layer 3 reach a predetermined thickness.

Figure 7:
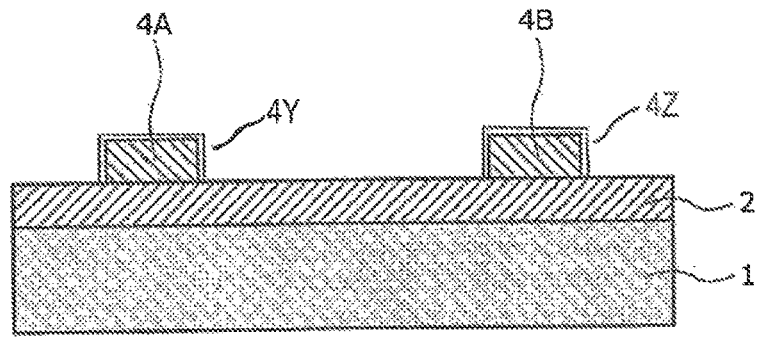
FIG. 7 is an explanatory view (part 6) of the procedure of manufacturing electroformed components according to the method of manufacturing electroformed components of the first embodiment according to the present invention.

Subsequently, as depicted in FIG. 7, the first photoresist layer 3 is removed from the conductive layer 2. The first photoresist layer 3 may be removed, for example, by immersing in a stripping solution, the silicon substrate 1 with the first electroformed member 4 and the first photoresist layer 3 planarized. The stripping solution is a chemical solution that dissolves the first photoresist layer 3 without dissolving the conductive layer 2, the first electroformed member 4, and the silicon substrate 1, and various known chemical solutions may be used.

Subsequently, a film for separation is formed on externally exposed surfaces that are the surfaces of the first electroformed components 4A, 4B, so as to facilitate separation of the second electroformed component from the first electroformed component. This film for separation may be achieved by a film (resin film) formed using a resin, a film formed using an organic compound, etc. containing carbon or hydrogen, a film (nitride film) formed using nitrogen, etc. These films for separation may be formed using known techniques.

Alternatively, the film for separation may be achieved by an oxide film 4Y, 4Z. For example, the oxide film 4Y, 4Z achieving the film for separation may be formed by putting the silicon substrate 1 with the first photoresist layer 3 removed as depicted in FIG. 7 into an oxidation furnace having a predetermined oxidizing atmosphere for oxidization, for a predetermined period. Alternatively, for example, the oxide film 4Y, 4Z achieving the film for separation may be achieved by a surface oxide film formed by exposing the silicon substrate 1 with the first photoresist layer 3 removed as depicted in FIG. 7 to the atmosphere for a predetermined period to oxidize the surface.

Figure 8:
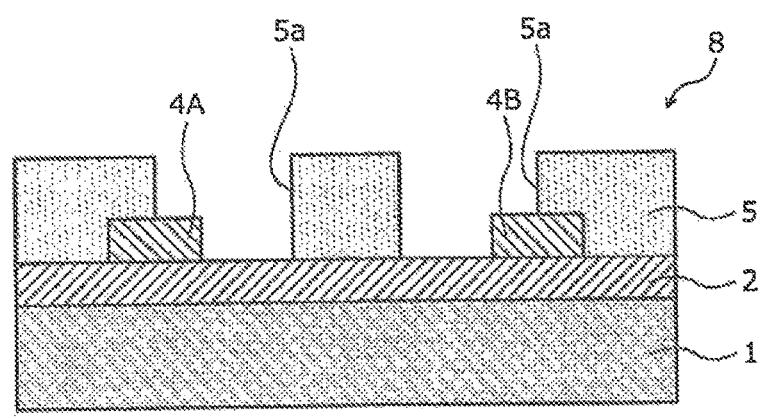
FIG. 8 is an explanatory view (part 7) of the procedure of manufacturing electroformed components according to the method of manufacturing electroformed components of the first embodiment according to the present invention.

Subsequently, as depicted in FIG. 8, a second photoresist layer 5 is formed on the front surface side of the conductive layer 2, and the second photoresist layer 5 is patterned to form an opening (second through-hole) 5a in the second photoresist layer 5. The opening 5a is formed to penetrate the second photoresist layer 5 in the thickness direction. The opening 5a is formed to partially overlap the first electroformed components 4A, 4B when the silicon substrate 1 is viewed in the plate thickness direction of the silicon substrate 1.

As a result, portions of the first electroformed components 4A, 4B not overlapping (not stacking) the second photoresist layer 5 partially project in the opening 5a. A second electroforming mold 8 is achieved by the second photoresist layer 5 with the opening 5a formed therein, the first electroformed components 4A, 4B projecting in the opening 5a, and the conductive layer 2.

At the time of formation of the second electroforming mold 8, for example, first, on the front surface side of the conductive layer 2, a positive type photoresist is applied to have a thickness greater than that of the second electroformed component to be manufactured, so as to form the second photoresist layer 5. The second photoresist layer 5 is formed to cover the first electroformed components 4A, 4B from the front surface side.

Subsequently, a photomask shielding a portion other than the portion corresponding to the opening 5a is set on the front surface side of the second photoresist layer 5. Ultraviolet rays, X-rays, etc. are applied for exposure with the photomask set. The second photoresist layer 5 (the silicon substrate 1) is then developed using an alkali solution, etc. to remove the portion exposed due to the ultraviolet rays, X-rays, etc. By such patterning, the opening 5a may be formed and the second electroforming mold 8 may be produced.

The second electroforming mold 8 may be formed in the same manner as the first electroforming mold 7 described above, and is not limited to those produced using a positive type photoresist. The second electroforming mold 8 may be produced using a negative type photoresist. In the case of using a negative type photoresist for forming the second electroforming mold 8, a photomask shielding only the portion corresponding to the opening 5a is used.

The film for separation described above may be formed on the surface where the first electroformed components 4A, 4B are brought into contact with the second electroformed component. For example, instead of providing the film for separation over the entire outer surfaces of the first electroformed components 4A, 4B exposed by removing the first photoresist layer 3 as depicted in FIG. 7, the film for separation may be formed on the surfaces of the first electroformed components 4A, 4B exposed in the opening 5a in the state of the second photoresist layer 5 having the opening 5a formed therein as depicted in FIG. 8.

Figure 9:
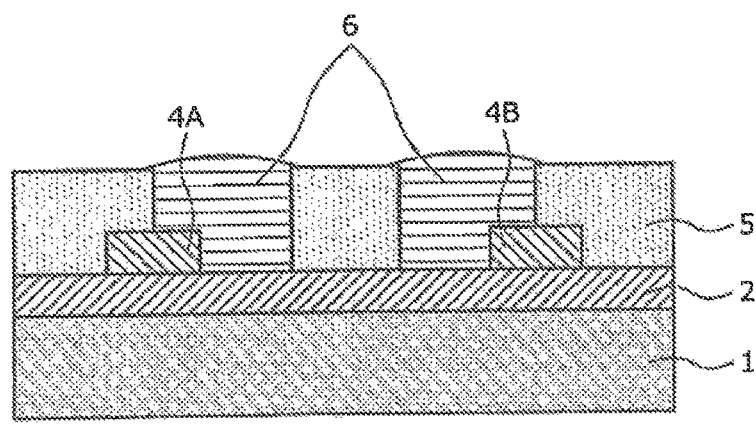
FIG. 9 is an explanatory view (part 8) of the procedure of manufacturing electroformed components according to the method of manufacturing electroformed components of the first embodiment according to the present invention.

Subsequently, as depicted in FIG. 9, electroforming is performed using the conductive layer 2 achieving the second electroforming mold 8 as one of the electrodes to deposit a second electroformed member 6 on the front surface side of the conductive layer 2 in the opening 5a in the second photoresist layer 5 and the front surface side of the first electroformed components 4A, 4B. At the time of electroforming for depositing the second electroformed member 6, the electrolytic solution 16 is filled in the electroforming tank 15 depicted in FIG. 5 described above, and the second electroforming mold 8 depicted in FIG. 9 is immersed in the bath of the electrolytic solution 16.

The second electroforming mold 8 is immersed in the bath of the electrolytic solution 16 with the second photoresist layer 5 side facing the counter electrode 17. As is the case with the electroforming for depositing the first electroformed member 4, an electrolytic solution used as the electrolytic solution 16 depends on a metal to be electroformed, i.e., a material forming the second electroformed member 6. The second electroformed member 6 may be achieved by the same metal as the first electroformed member 4 or may be achieved by a metal different from the first electroformed member 4.

At the time of electroforming for depositing the second electroformed member 6, subsequently, a DC voltage is applied by the power source 18, as is the case with the electroforming for depositing the first electroformed member 4, between the conductive layer 2 of the second electroforming mold 8 and the counter electrode 17 in the state of being immersed in the bath of the electrolytic solution 16. In this case, the counter electrode 17 serves as a positive electrode (anode) and the conductive layer 2 serves as a negative electrode (cathode). By applying the DC voltage, metal ions electrolyzed from the counter electrode 17 in the electrolytic solution 16 migrate in the direction indicated by the arrows F in FIG. 5 and are electrodeposited on the front surface side of the conductive layer 2 in the opening 5a of the second photoresist layer 5 of the second electroforming mold 8. The electroforming for depositing the second electroformed member 6 is performed until the second electroformed member 6 is formed having such a thickness allowing the member to somewhat project and rise from the surface of the second photoresist layer 5.

The second electroformed member 6 is deposited such that the film for separation for facilitating the separation of the second electroformed component described above is interposed between the second electroformed member 6 and the first electroformed components 4A, 4B. Therefore, between the first electroformed components 4A, 4B and the second electroformed member 6, the film for separation for facilitating the separation of the second electroformed component described above is interposed between surfaces facing each other.

Figure 10:
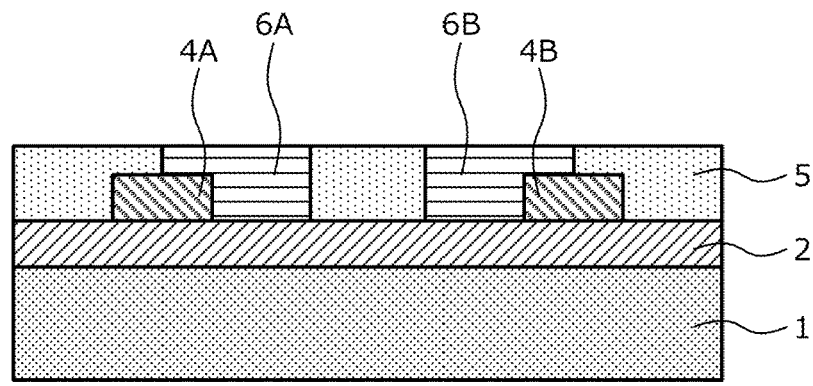
FIG. 10 is an explanatory view (part 9) of the procedure of manufacturing electroformed components according to the method of manufacturing electroformed components of the first embodiment according to the present invention.

Subsequently, as depicted in FIG. 10, the second electroformed member 6 and the second photoresist layer 5 are planarized on the front surface side to form second electroformed components 6A, 6B. For example, a portion of the front surface side of the second electroformed member 6 is ground and planarized along with the second photoresist layer 5 to form the second electroformed components 6A, 6B. The planarization is performed until the second electroformed member 6 and the second photoresist layer 5 reach a predetermined thickness. The grinding at the time of planarizing the portion of the front surface side of the second electroformed member 6 and the front surface side of the second photoresist layer 5 includes "grinding" using a grinder (grindstone) and "polishing" making surface texture (surface roughness) smoother as compared to the grinding using a grindstone. The planarization of the second electroformed member 6 and the second photoresist layer 5 is performed until the second electroformed member 6 and the second photoresist layer 5 reach a predetermined thickness.

Figure 11:
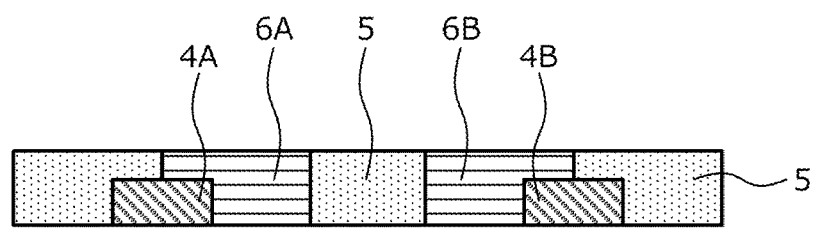
FIG. 11 is an explanatory view (part 10) of the procedure of manufacturing electroformed components according to the method of manufacturing electroformed components of the first embodiment according to the present invention.

Subsequently, as depicted in FIG. 11, the silicon substrate 1 and the conductive layer 2 are removed. The silicon substrate 1 and the conductive layer 2 may be removed, for example, by grinding the silicon substrate 1 and the conductive layer 2 from the back surface side of the silicon substrate 1. The grinding at the time of removing the silicon substrate 1 and the conductive layer 2 includes "grinding" using a grinder (grindstone) and "polishing" making surface texture (surface roughness) smoother as compared to the grinding using a grindstone. As a result, the silicon substrate 1 and the conductive layer 2 are removed to leave a structure made up of the first electroformed components 4A, 4B, the second electroformed components 6A, 6B, and the second photoresist layer 5.

When the silicon substrate 1 and the conductive layer 2 are removed, a reinforcing support plate or a protective seal may be affixed as needed onto the front surface sides of the second photoresist layer 5 and the second electroformed components 6A, 6B planarized as depicted in FIG. 10, so as to support (reinforce) the second photoresist layer 5 and the second electroformed components 6A, 6B. As a result, when the silicon substrate 1 and the conductive layer 2 are removed by grinding and polishing, a portion of the structure such as the first electroformed components 4A, 4B may be prevented from falling off, so that the silicon substrate 1 and the conductive layer 2 may easily be removed.

Figure 12:
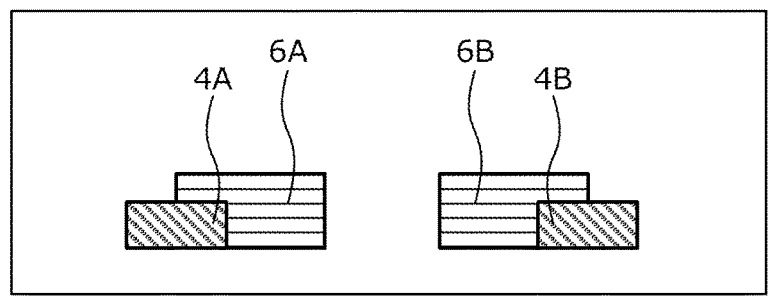
FIG. 12 is an explanatory view (part 11) of the procedure of manufacturing electroformed components according to the method of manufacturing electroformed components of the first embodiment according to the present invention.

Subsequently, as depicted in FIG. 12, the second photoresist layer 5 is removed. The second photoresist layer 5 may be removed, for example, by immersing the structure depicted in FIG. 11 in a stripping solution to dissolve the second photoresist layer 5. As a result, the first electroformed components 4A, 4B and the second electroformed components 6A, 6B remain in a close contact state.

Figure 13:
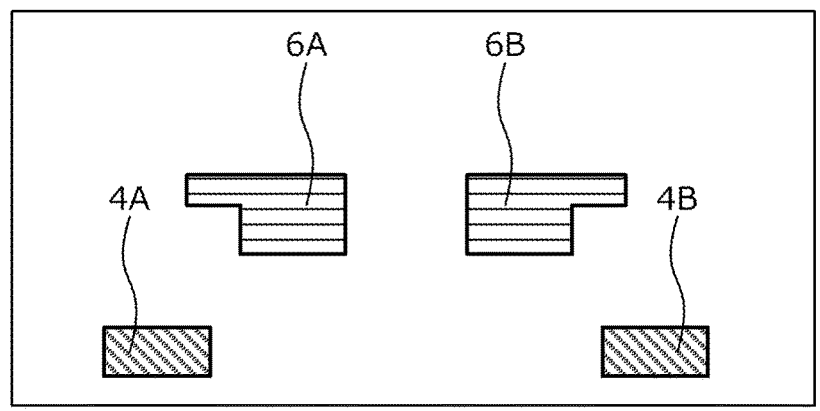
FIG. 13 is an explanatory view (part 12) of the procedure of manufacturing electroformed components according to the method of manufacturing electroformed components of the first embodiment according to the present invention.

Subsequently, as depicted in FIG. 13, the first electroformed components 4A, 4B and the second electroformed components 6A, 6B are taken out individually. Since the film for separation for facilitating the separation of the second electroformed component is interposed between the contact surfaces of the first electroformed components 4A, 4B and the second electroformed components 6A, 6B as described above, the first electroformed components 4A, 4B and the second electroformed components 6A, 6B may be separated without damage, and the first electroformed components 4A, 4B and the second electroformed components 6A, 6B may individually be taken out, by simply applying a slight force at the time of removal of the second photoresist layer 5.

In this way, the stepped second electroformed components 6A, 6B having step portions formed in portions overlapping the first electroformed components 4A, 4B and the flat-plate first electroformed components 4A, 4B, may be efficiently and accurately manufactured concurrently in a series of manufacturing steps. If the first electroformed components 4A, 4B and the second electroformed components 6A, 6B have surfaces that move relative to each other while partially in close contact or abutting each other as depicted in FIG. 12, the surfaces may be formed accurately. For the materials of the first electroformed components 4A, 4B and the second electroformed components 6A, 6B, the metals optimal for respective use applications may be selected.

The manufacturing of the electroformed component in the first embodiment has been described with an example of using the silicon substrate 1 as the substrate. The silicon substrate 1 may be subjected to etching processing by a Deep RIE (D-RIE) technique. Therefore, in the manufacturing of the electroformed component in the first embodiment, the shape of the electroforming molds (the first electroforming mold 7 and the second electroforming mold 8) may be processed easily using the silicon substrate 1 as the substrate.

As a result, a degree of freedom of the shapes of the electroforming molds (the first electroforming mold 7 and the second electroforming mold 8) may be increased to form the electroforming molds (the first electroforming mold 7 and the second electroforming mold 8) having complicated shapes. For example, by performing an etching process corresponding to the shapes of lower portions of the first electroformed components 4A, 4B (on the conductive layer 2 sides of the first electroformed components 4A, 4B) with respect to the silicon substrate 1 in the state depicted in FIG. 1 before forming the conductive layer 2 as depicted in FIG. 2, the lower portions of the first electroformed components 4A, 4B may be formed into complicated shapes.

The first electroformed components 4A, 4B depicted in FIGS. 6 to 13 described above may be respective independent components or may be integrated components. The second electroformed components 6A, 6B depicted in FIGS. 10 to 13 described above may be respective independent components or may be integrated components. The first electroformed components 4A, 4B may be respective independent components while the second electroformed components 6A, 6B are integrated components. Alternatively, the first electroformed components 4A, 4B may be integrated components while the second electroformed components 6A, 6B are respective independent components.

(Examples of First Electroformed Component and Second Electroformed Component)

Figure 14:
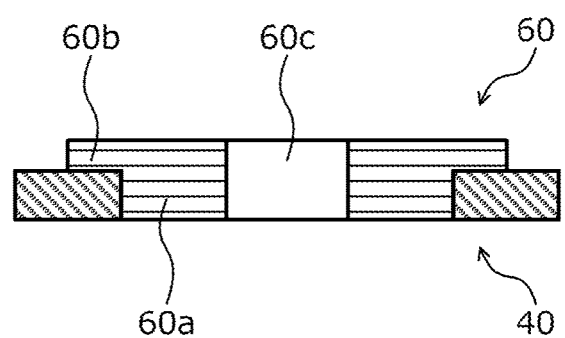
FIG. 14 is an explanatory view (part 1) of a portion of a procedure of manufacturing electroformed components according to the method of manufacturing electroformed components of the first embodiment according to the present invention.
Figure 15:
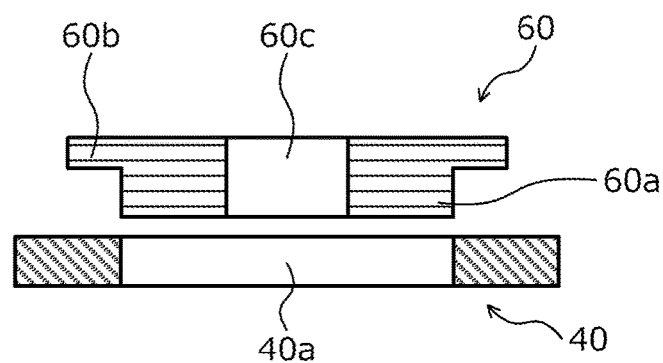
FIG. 15 is an explanatory view (part 2) of a portion of the procedure of manufacturing electroformed components according to the method of manufacturing electroformed components of the first embodiment according to the present invention.

Examples of the first electroformed component and the second electroformed component manufactured by the method of manufacturing electroformed components of the first embodiment described above will be described. FIGS. 14 and 15 are explanatory views of a portion of a procedure of manufacturing electroformed components according to the method of manufacturing electroformed components of the first embodiment according to the present invention.

FIGS. 14 and 15 depict a portion of a procedure of manufacturing electroformed components when the first electroformed components 4A, 4B are integrated components and the second electroformed components 6A, 6B are integrated components. FIG. 14 depicts a step corresponding to the step depicted in FIG. 12 described above. FIG. 15 depicts a step corresponding to the step depicted in FIG. 13 described above.

When the first electroformed components 4A, 4B are integrated components and the second electroformed components 6A, 6B are integrated components, the first electroformed components 4A, 4B constitute a single first electroformed component 40 in the state after removal of the second photoresist layer 5 as depicted in FIGS. 14 and 15. Also in this state, as depicted in FIGS. 14 and 15, the second electroformed components 6A, 6B constitutes a single second electroformed component 60.

The second electroformed component 60 may be achieved by a member forming a substantially cylindrical shape, for example. As depicted in FIGS. 14 and 15, the second electroformed component 60 includes a cylindrical portion 60a. The cylindrical portion 60a has a flange portion 60b provided at an end portion on the front surface side.

In the second electroformed component 60, a center hole 60c penetrating the cylindrical portion 60a in the axial direction is formed in the inner circumference of the cylindrical portion 60a. The inner diameter of the center hole 60c is set to the same dimension in the cylindrical portion 60a and the flange portion 60b. Therefore, the inner diameter of the flange portion 60b is equal to the inner diameter of the cylindrical portion 60a, and the outer diameter of the flange portion 60b is larger than the outer diameter of the cylindrical portion 60a. For example, the second electroformed component 60 as described above may be achieved by a stepped component such as a bearing including a step at the boundary between the cylindrical portion 60a and the flange portion 60b, for example.

The first electroformed component 40 may be achieved by an annular member forming a flat plate shape including a circular opening portion 40a at a center portion as depicted in FIG. 15, for example. In particular, the first electroformed component 40 may be achieved by a ring or a gear, for example. In the first electroformed component 40, the inner diameter of the opening portion 40a is formed to be the same as (or slightly larger than) the outer diameter of the cylindrical portion 60a.

As a result, by fitting the cylindrical portion 60a of the second electroformed component 60 into the opening 40a, the first electroformed component 40 and the second electroformed component 60 may be moved relative to each other while allowing the inner circumferential surface of the first electroformed component 40 and the outer circumferential surface of the second electroformed component 60 to come into close contact with (or to abut) each other.

The first electroformed component 40 and the second electroformed component 60 may be a large gear and a small gear (pinion) fitting to each other in a shaft portion. The first electroformed component 40 and the second electroformed component 60 may be components fitted to each other in a relatively rotatable manner. The first electroformed component 40 and the second electroformed component 60 may be any components having surfaces moving relative to each other while in close contact or abutting each other and are not limited to annular, cylindrical, or columnar components.

As described above, according to the method of manufacturing electroformed components of the first embodiment, two types of electroformed components having portions fitted to each other to be in close contact as in the case of the first electroformed component 40 and the second electroformed component 60 may be manufactured with high accuracy in a series of manufacturing steps. In particular, since the second electroformed component 60 is formed using the opening portion 40a in the first electroformed component 40 as a mold, the first electroformed component 40 and the second electroformed component 60 formed may be fitted accurately without a gap or causing rattle.

According to the method of manufacturing electroformed components of the first embodiment, even when at least one of the components fitted to each other is a component (stepped component) including a step portion like a boundary portion between the cylindrical portion 60a and the flange portion 60b of the second electroformed component 60, these two types of electroformed components may be manufactured with high accuracy in a series of manufacturing steps. Therefore, even when multiple types of components to be fitted to each other are manufactured and at least one of the components is the stepped component, the components may be fitted accurately without a gap or causing rattle between the components in the fitted state.

As a result, even when the components fitted to each other move (slide) relative to each other while in close contact or abutting each other, the components may be moved (slid) relative to each other accurately without a gap or causing rattle between the components. This makes it possible to prevent damage of the components attributable to an impact of collision between components or fatigue from friction between the components due to relative movement between these components and thus, the durability of the components may be improved.

<Second Embodiment>

A method of manufacturing electroformed components of a second embodiment according to the present invention will be described. In the second embodiment, portions identical to those in the first embodiment described above are denoted by the same reference characters used in the first embodiment and will not be described. FIGS. 16, 17, 18, 19, 20, 21, and 22 are explanatory views of a portion of a procedure of manufacturing electroformed components according to the method of manufacturing electroformed components of the second embodiment according to the present invention. In the procedure of manufacturing electroformed components according to the method of manufacturing electroformed components of the second embodiment, steps identical to the steps depicted in FIGS. 1 to 4 and 6 described above are executed, and steps depicted in FIGS. 16 to 22 are subsequently executed.

(Procedure of Manufacturing Electroformed Components)

Figure 16:
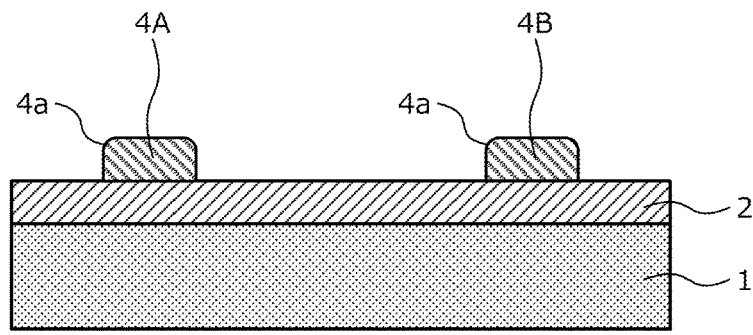
FIG. 16 is an explanatory view (part 1) of a portion of a procedure of manufacturing electroformed components according to the method of manufacturing electroformed components of a second embodiment according to the present invention.

In manufacturing of electroformed components according to the method of manufacturing electroformed components of the second embodiment, first, as is the case with the steps depicted in FIGS. 1 to 4 and 6, the first electroformed member 4 and the first photoresist layer 3 are planarized on the front surface side to form the first electroformed components 4A, 4B. Subsequently, as depicted in FIG. 16, corners of the first electroformed components 4A, 4B are chamfered (rounded). This chamfering is performed at least on the corners in portions of the first electroformed components 4A, 4B located in the opening 5a.

For example, the chamfering may be achieved by performing electrolytic polishing on the first electroformed components 4A, 4B. In the electrolytic polishing, first, as depicted in FIG. 6 described above, the silicon substrate 1 with the first electroformed member 4 and the first photoresist layer 3 planarized (see FIG. 6 described above) is immersed in the electrolytic solution 16 filled in the electroforming tank 15 depicted in FIG. 5. In this case, the silicon substrate 1 is immersed in the bath of the electrolytic solution 16 such that the side of the first electroformed components 4A, 4B (the front surface side of the silicon substrate 1) faces the counter electrode 17.

Then, a DC voltage is applied by the power source 18 between the conductive layer 2 of the silicon substrate 1 and the counter electrode 17 in the state of being immersed in the bath of the electrolytic solution 16. The DC voltage is applied such that the counter electrode 17 serves as a negative electrode (cathode) while the conductive layer 2 and the first electroformed components 4A, 4B serve as a positive electrode (anode). Therefore, the DC voltage may be applied by applying a voltage having a polarity opposite to the case of the electroforming described above.

The DC voltage is applied with the conductive layer 2 and the first electroformed components 4A, 4B used as the anode and the counter electrode 17 used as the cathode. By applying the DC voltage in this way, electric current flows in the electrolytic solution 16 in the direction opposite to the case of the electroforming described above, and the first electroformed components 4A, 4B are electrolyzed. The metal ions generated by the electrolysis of the first electroformed components 4A, 4B migrate in the direction opposite to the direction indicated by the arrows F in FIG. 5.

At the time of the electrolysis of the first electroformed components 4A, 4B, the corners preferentially dissolve. As a result, the corners of the first electroformed components 4A, 4B are chamfered, and chamfered portions 4a are formed in the first electroformed components 4A, 4B. Electrolytic polishing (application of the DC voltage) is performed for a predetermined period depending on the shapes of the first electroformed components 4A, 4B and the second electroformed components 6A, 6B and the size of the first electroformed components 4A, 4B.

When the predetermined period for performing the electrolytic polishing is longer, the corners are more electrolyzed (melted) and chamfered to a greater extent to form a more gentle round shape, as compared to when the period is shorter. In the manufacturing of the electroformed components according to the method of manufacturing electroformed components of the second embodiment, the predetermined period for performing the electrolytic polishing is set to a short time such that the first electroformed components 4A, 4B after the electrolytic polishing are chamfered only on the corners and have shapes substantially equivalent to those of the first electroformed components 4A, 4B before the electrolytic polishing.

The chamfered portions 4a are not limited to those formed by electrolytic polishing. The chamfered portions 4a may be formed by wet etching instead of electrolytic polishing. The wet etching in this case is performed by immersing the silicon substrate 1 with the first electroformed member 4 and the first photoresist layer 3 planarized, in an etchant dissolving the first electroformed components 4A, 4B (the first electroformed member 4), for a predetermined period.

Also in the case of the wet etching, corners of the first electroformed components 4A, 4B preferentially dissolve as is the case with the electrolytic polishing. As a result, the corners of the first electroformed components 4A, 4B are chamfered, and the chamfered portions 4a are formed in the first electroformed components 4A, 4B. The wet etching is performed for a predetermined period depending on the shapes of the first electroformed components 4A, 4B and the second electroformed components 6A, 6B and the size of the first electroformed components 4A, 4B.

When the predetermined period of performing the wet etching is longer, the corners are more electrolyzed (melted) and chamfered to a greater extent to form a more gentle round shape, as compared to when the time is shorter. In the manufacturing of the electroformed components according to the method of manufacturing electroformed components of the second embodiment, when the chamfering is performed by the wet etching, the predetermined period for performing the wet etching is set to a short time such that the first electroformed components 4A, 4B after the wet etching are chamfered only on the corners and have shapes substantially equivalent to those of the first electroformed components 4A, 4B before the wet etching.

Figure 17:
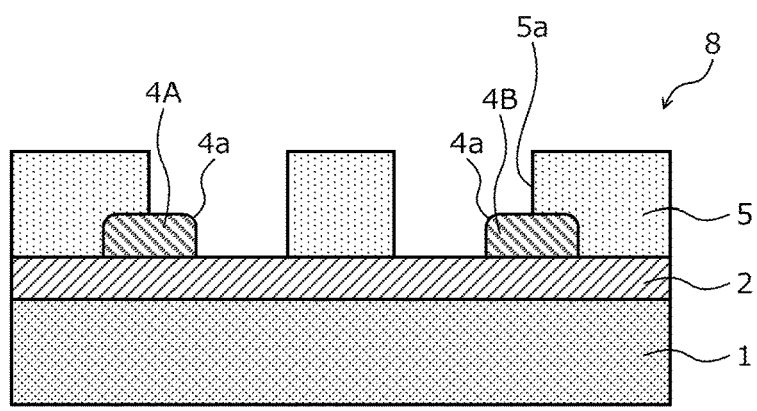
FIG. 17 is an explanatory view (part 2) of a portion of the procedure of manufacturing electroformed components according to the method of manufacturing electroformed components of the second embodiment according to the present invention.

Subsequently, after chamfering of the corners of the first electroformed components 4A, 4B, a film for separation is formed on externally exposed surfaces that are the surfaces of the first electroformed components 4A, 4B. As depicted in FIG. 17, the second photoresist layer 5 is then formed on the front surface side of the conductive layer 2, and the second photoresist layer 5 is patterned to form the opening (second through-hole) 5a in the second photoresist layer 5. As is the case with the first embodiment described above, the opening 5a is formed to penetrate the second photoresist layer 5 in the thickness direction. As is the case with the first embodiment described above, the opening 5a is formed to partially overlap the first electroformed components 4A, 4B when the silicon substrate 1 is viewed in the plate thickness direction of the silicon substrate 1.

Figure 18:
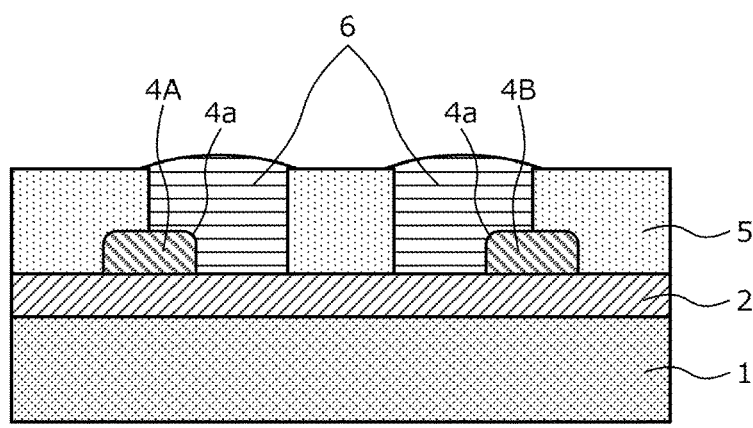
FIG. 18 is an explanatory view (part 3) of a portion of the procedure of manufacturing electroformed components according to the method of manufacturing electroformed components of the second embodiment according to the present invention.

As a result, portions of the first electroformed components 4A, 4B not overlapping (not stacked on) the second photoresist layer 5 partially project in the opening 5a. The chamfered portions 4a of the first electroformed components 4A, 4B are projected in the opening 5a. In this state, as depicted in FIG. 18, electroforming is performed using the conductive layer 2 as one of the electrodes as is the case with the first embodiment described above until the second electroformed member 6 is formed to have such a thickness allowing the member to somewhat project and rise from the surface of the second photoresist layer 5.

The second electroformed member 6 has a round shape curved to cover the chamfered portions 4a in a portion facing the chamfered portions 4a in the first electroformed components 4A, 4B. Since the chamfered portions 4a are formed on the corners of the first electroformed components 4A, 4B, the inner corners of the second electroformed member 6 formed by electroforming and overlapped thereon have a corresponding concave curve (or a slope shape) transferred from the chamfered portions 4a.

With regard to the film for separation described above, for example, instead of providing the film for separation over the entire outer surfaces of the first electroformed components 4A, 4B exposed by removing the first photoresist layer 3 as depicted in FIG. 16, the film for separation may be formed on the surfaces of the first electroformed components 4A, 4B exposed in the opening 5a in the state of the second photoresist layer 5 having the opening 5a formed therein as depicted in FIG. 17.

Figure 19:
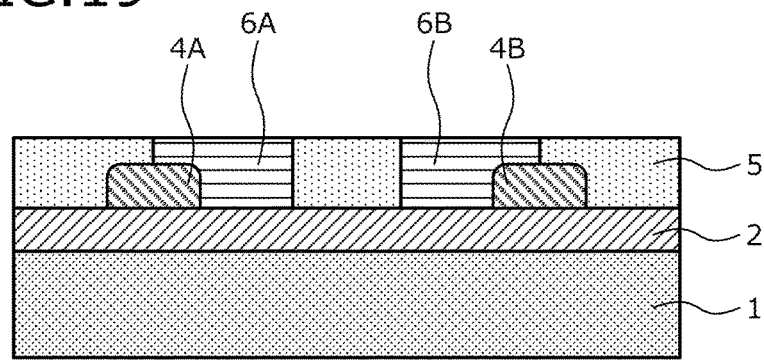
FIG. 19 is an explanatory view (part 4) of a portion of the procedure of manufacturing electroformed components according to the method of manufacturing electroformed components of the second embodiment according to the present invention.
Figure 20:
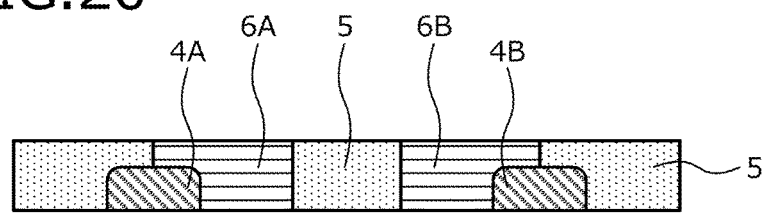
FIG. 20 is an explanatory view (part 5) of a portion of the procedure of manufacturing electroformed components according to the method of manufacturing electroformed components of the second embodiment according to the present invention.
Figure 21:
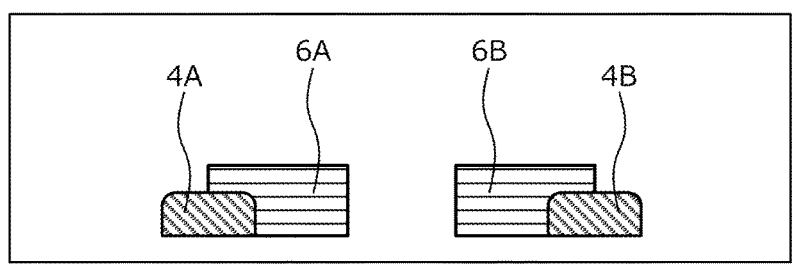
FIG. 21 is an explanatory view (part 6) of a portion of the procedure of manufacturing electroformed components according to the method of manufacturing electroformed components of the second embodiment according to the present invention.
Figure 22:
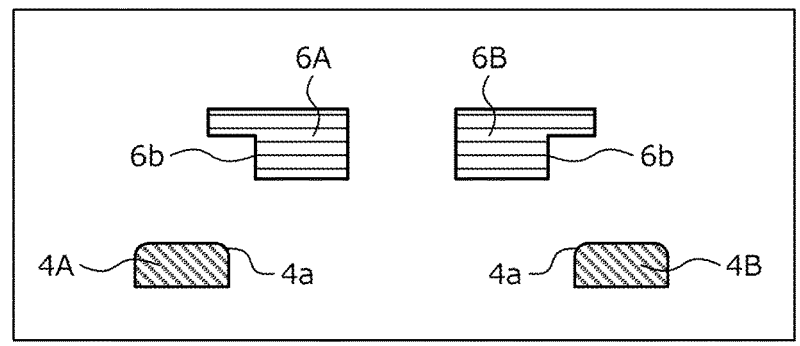
FIG. 22 is an explanatory view (part 7) of a portion of the procedure of manufacturing electroformed components according to the method of manufacturing electroformed components of the second embodiment according to the present invention.

Subsequently, the same steps as those depicted in FIGS. 10 to 13 in the first embodiment described above are executed. In particular, the second electroformed member 6 and the second photoresist layer 5 are planarized as depicted in FIG. 19, and the silicon substrate 1 and the conductive layer 2 are then removed as depicted in FIG. 20. Subsequently, after removing the second photoresist layer 5 as depicted in FIG. 21, the first electroformed components 4A, 4B and the second electroformed components 6A, 6B are taken out individually as depicted in FIG. 22.

As described above, the chamfered portions 4a are formed on the corners of the first electroformed components 4A, 4B. Therefore, as depicted in FIG. 22, corners 6b facing the chamfered portions 4a in the second electroformed components 6A, 6B also have a concave curve (or a slope shape) corresponding to the chamfered portions 4a of the first electroformed components 4A, 4B.

As a result, stress may be distributed in the chamfered portions 4a in the first electroformed components 4A, 4B and the corners 6b in the second electroformed components 6A, 6B. Therefore, the first electroformed components 4A, 4B and the second electroformed components 6A, 6B may be increased in strength and improved in durability.

As described above, according to the method of manufacturing electroformed components of the second embodiment, the first electroformed components 4A, 4B are chamfered at least on the corners in the portions overlapping the second electroformed components 6A, 6B located in the opening 5a. As a result, edges may be eliminated at the portions of contact between the first electroformed components 4A, 4B (the first electroformed component 40) and the second electroformed components 6A, 6B (the second electroformed component 60).

Therefore, even when at least one of the components fitted to each other is a stepped component including a step portion like a boundary portion between the cylindrical portion 60a and the flange portion 60b of the second electroformed component 60, local concentration of stress due to contact may be eliminated and the stress may be distributed. As a result, the first electroformed components 4A, 4B and the second electroformed components 6A, 6B may be increased in strength and improved in durability, in addition to obtaining the effects of the method of manufacturing electroformed components of the first embodiment described above.

Additionally, according to the method of manufacturing the electroformed component of the second embodiment, corners of the electroformed components may be chamfered (rounded). As a result, the esthetics of the electroformed components may be improved to increase the beauty in appearance. Particularly when the electroformed components manufactured by the method of manufacturing electroformed components of the second embodiment are used as components of a timepiece in which the movement is visible, the esthetics of the timepiece may be improved to increase the beauty in appearance.

Also in the manufacturing of electroformed components according to the method of manufacturing electroformed components of the second embodiment, as is the case with the first electroformed component 40 and the second electroformed component 60 depicted in FIGS. 14 and 15, an annular flat-plate component and a stepped cylindrical or columnar component having a stepped portion at a portion overlapping therewith may be manufactured in a series of manufacturing steps. In this case, even when the first electroformed component 40 and the second electroformed component 60 have surfaces rotating (moving) relative to each other while in close contact due to fitting, etc., the corner 4a of the portion in close contact is chamfered and has no edge and therefore, local concentration of stress due to contact may be eliminated to increase the strength and improve the durability of the electroformed components.

<Third Embodiment>

A method of manufacturing electroformed components of a third embodiment according to the present invention will be described. In the third embodiment, portions identical to those in the first and second embodiments described above are denoted by the same reference characters used in the first and second embodiments and will not be described. FIGS. 23, 24, 25, 26, 27, 28, 29, 30, 31, 32, and 33 are explanatory views of a procedure of manufacturing electroformed components according to the method of manufacturing electroformed components of the third embodiment according to the present invention.

(Procedure of Manufacturing Electroformed Components)

Figure 23:
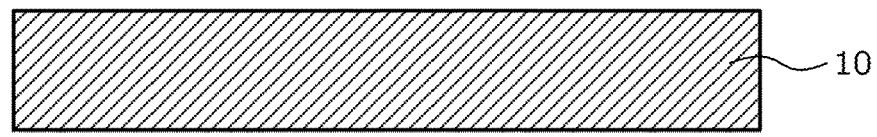
FIG. 23 is an explanatory view (part 1) of a procedure of manufacturing electroformed components according to the method of manufacturing electroformed components of a third embodiment according to the present invention.

In the manufacturing of electroformed components according to the method of manufacturing electroformed components of the third embodiment, first, as depicted in FIG. 23, a substrate 10 is prepared. The substrate 10 may be formed using a conductive material having favorable conductivity, for example. For example, the substrate 10 may be formed using a conductive material including metal (including alloy) such as copper, brass, and stainless steel.

In the method of manufacturing electroformed components of the third embodiment, use of the substrate 10 formed using a conductive material eliminates the need for steps of forming the conductive layer 2 on the surface of the substrate (silicon substrate) 1 in the first and second embodiments described above (see FIG. 2). In the third embodiment, a metal substrate formed using a conductive material is used as the substrate 10. In the description hereinafter, the metal substrate will be denoted by reference character 10.

Figure 24:
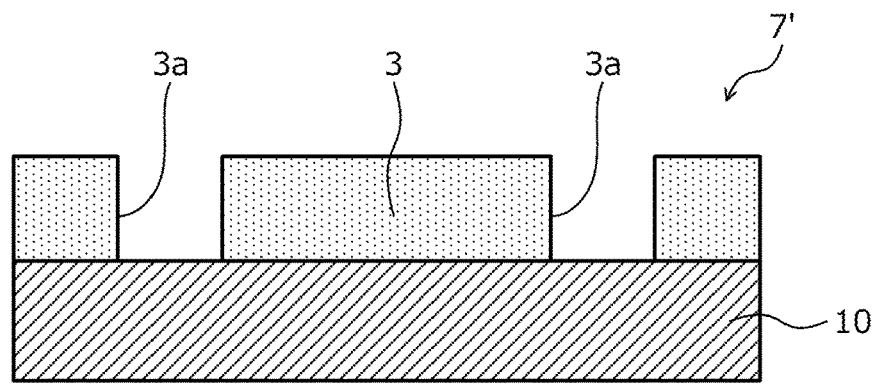
FIG. 24 is an explanatory view (part 2) of the procedure of manufacturing electroformed components according to the method of manufacturing electroformed components of the third embodiment according to the present invention.

Subsequently, the same steps as those depicted in FIGS. 3, 4, and 6 to 13 in the first embodiment described above are executed. In particular, first, the first photoresist layer 3 is formed on the front surface side of the metal substrate 10, and the first photoresist layer 3 is patterned to form the opening (first through-hole) 3a in the first photoresist layer 3 as depicted in FIG. 24. A first electroforming mold 7' is achieved by the first photoresist layer 3 formed on the front surface side of the metal substrate 10 and having the opening 3a formed therein, and the metal substrate 10.

Figure 25:
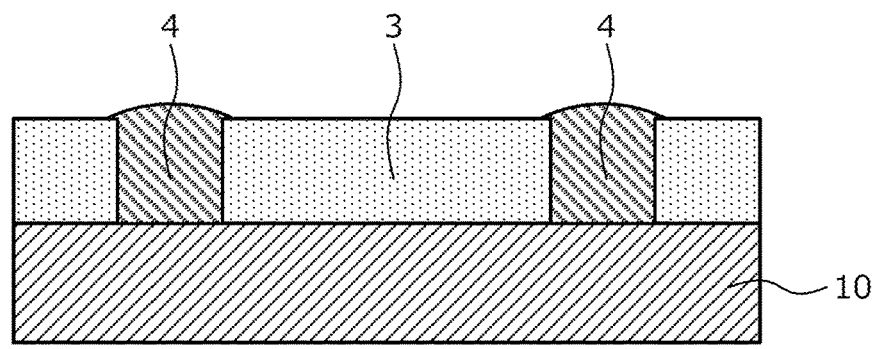
FIG. 25 is an explanatory view (part 3) of the procedure of manufacturing electroformed components according to the method of manufacturing electroformed components of the third embodiment according to the present invention.
Figure 26:
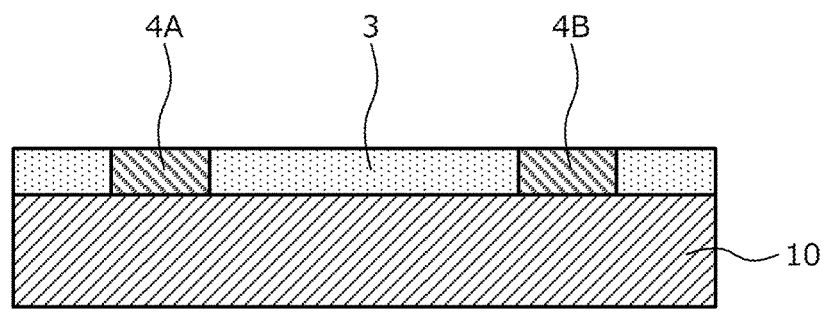
FIG. 26 is an explanatory view (part 4) of the procedure of manufacturing electroformed components according to the method of manufacturing electroformed components of the third embodiment according to the present invention.

Subsequently, as depicted in FIG. 25, electroforming is performed using the metal substrate 10 achieving the first electroforming mold 7' as one of electrodes as is the case with the first embodiment described above to deposit the first electroformed member 4 on the front surface side of the metal substrate 10 in the opening 3a in the first photoresist layer 3. As in the first embodiment described above, as depicted in FIG. 26, the first electroformed member 4 and the first photoresist layer 3 are planarized on the front surface side to form the first electroformed components 4A, 4B.

Figure 27:
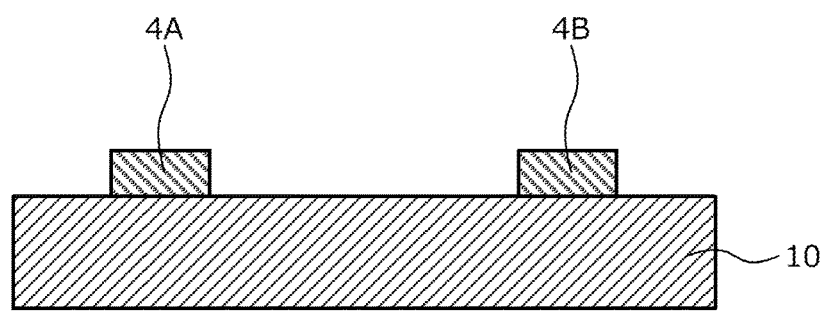
FIG. 27 is an explanatory view (part 5) of the procedure of manufacturing electroformed components according to the method of manufacturing electroformed components of the third embodiment according to the present invention.

Subsequently, as depicted in FIG. 27, the first photoresist layer 3 is removed from the metal substrate 10. For example, the first photoresist layer 3 may be removed as is the case with the first embodiment described above by immersing in a stripping solution, the metal substrate 10 with the first electroformed member 4 and the first photoresist layer 3 planarized. A film for separation is then formed on externally exposed surfaces that are the surfaces of the first electroformed components 4A, 4B.

Figure 28:
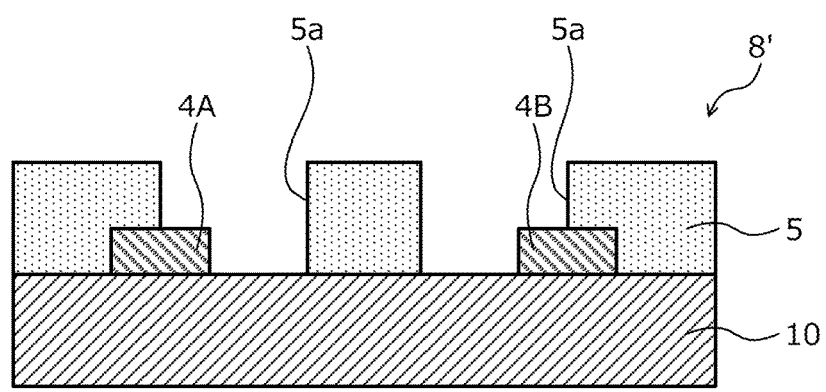
FIG. 28 is an explanatory view (part 6) of the procedure of manufacturing electroformed components according to the method of manufacturing electroformed components of the third embodiment according to the present invention.

Subsequently, the second photoresist layer 5 is formed on the front surface side of the metal substrate 10, and the second photoresist layer 5 is patterned to form the opening (second through-hole) 5a in the second photoresist layer 5 as depicted in FIG. 28. A second electroforming mold 8' is achieved by the second photoresist layer 5 formed on the front surface side of the metal substrate 10 and having the opening 5a formed therein, and the metal substrate 10.

Figure 29:
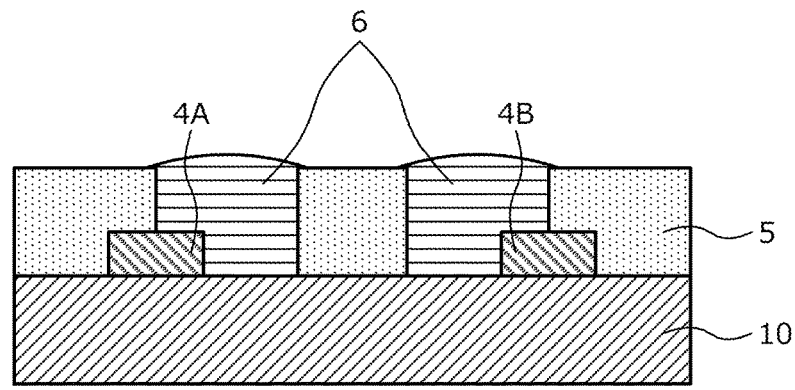
FIG. 29 is an explanatory view (part 7) of the procedure of manufacturing electroformed components according to the method of manufacturing electroformed components of the third embodiment according to the present invention.
Figure 30:
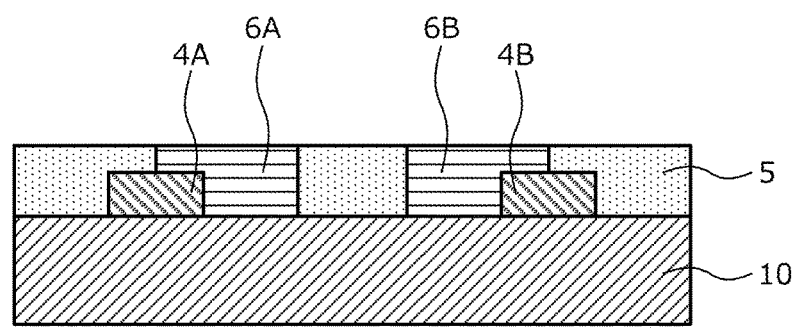
FIG. 30 is an explanatory view (part 8) of the procedure of manufacturing electroformed components according to the method of manufacturing electroformed components of the third embodiment according to the present invention.

Subsequently, as depicted in FIG. 29, electroforming is performed using the metal substrate 10 achieving the second electroforming mold 8' as one of the electrodes as is the case with the first embodiment described above to deposit the second electroformed member 6 on the front surface side of the metal substrate 10 in the opening 5a in the second photoresist layer 5 and the front surface side of the first electroformed components 4A, 4B. As depicted in FIG. 30, a portion on the front surface side of the second electroformed member 6 is ground and planarized along with the second photoresist layer 5 to form the second electroformed components 6A, 6B.

Figure 31:
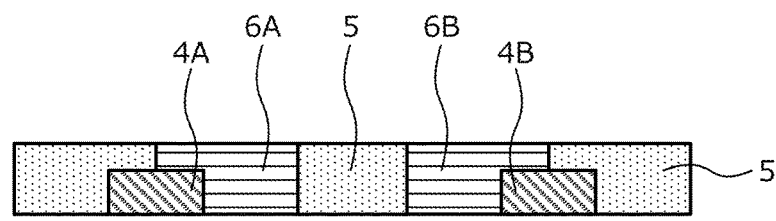
FIG. 31 is an explanatory view (part 9) of the procedure of manufacturing electroformed components according to the method of manufacturing electroformed components of the third embodiment according to the present invention.
Figure 32:
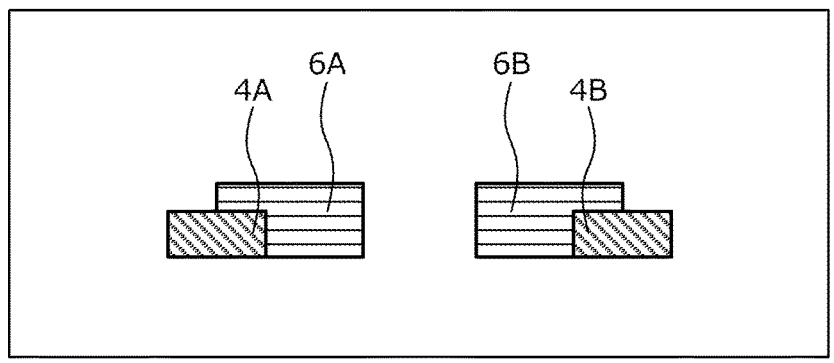
FIG. 32 is an explanatory view (part 10) of the procedure of manufacturing electroformed components according to the method of manufacturing electroformed components of the third embodiment according to the present invention.

Subsequently, after the metal substrate 10 is removed as depicted in FIG. 31, the second photoresist layer 5 is removed as depicted in FIG. 32. For example, the metal substrate 10 may be removed by grinding the metal substrate 10 from the surface (back surface) side opposite to the surface (front surface) on which the first electroformed components 4A, 4B and the second electroformed components 6A, 6B are formed on the metal substrate 10.

Figure 33:
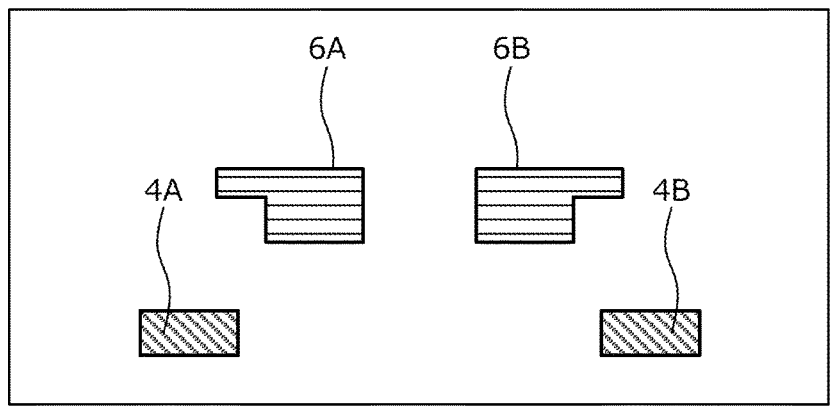
FIG. 33 is an explanatory view (part 11) of the procedure of manufacturing electroformed components according to the method of manufacturing electroformed components of the third embodiment according to the present invention.

Subsequently, as depicted in FIG. 33, the first electroformed components 4A, 4B and the second electroformed components 6A, 6B are taken out individually. Since the film for separation is formed between the first electroformed components 4A, 4B and the second electroformed components 6A, 6B, the first electroformed components 4A, 4B and the second electroformed components 6A, 6B may be separated and taken out without damage.

As described above, according to the method of manufacturing electroformed components of the third embodiment, as is the case with the first embodiment described above, two types of electroformed components having portions fitted to each other to be in dose contact as in the case of the first electroformed component 40 and the second electroformed component 60 may be manufactured with high accuracy in a series of manufacturing steps. In particular, since the second electroformed component 60 is formed using the opening portion 40a in the first electroformed component 40 as a mold, the first electroformed component 40 and the second electroformed component 60 formed may be fitted accurately without a gap or causing rattle.

According to the method of manufacturing electroformed components of the third embodiment, as is the case with the first embodiment described above, even when at least one of the components fitted to each other is a stepped component including a step portion like a boundary portion between the cylindrical portion 60a and the flange portion 60b of the second electroformed component 60, these two types of electroformed components may be manufactured with high accuracy in a series of manufacturing steps. Therefore, even when multiple types of components to be fitted to each other are manufactured and at least one of the components is the stepped component, the components may be fitted accurately without a gap or causing rattle between the components in the fitted state.

As a result, even when the components fitted to each other move (slide) relative to each other while in close contact or abutting each other, the components may be moved (slid) accurately relative to each other without a gap or causing rattle between the components. This makes it possible to prevent damage of the components attributable to an impact of collision between components or fatigue from friction between the components due to relative movement between these components and thus, the durability of the components may be improved.

Furthermore, according to the method of manufacturing electroformed components of the third embodiment, since the step of forming the conductive layer 2 on the front surface side of the substrate (silicon substrate) 1 becomes unnecessary as compared to the first and second embodiments described above, the number of steps of manufacturing the electroformed components may be reduced to shorten the time required for manufacturing the electroformed components.

Moreover, since the metal substrate 10 has higher durability than the substrate 1 made of an insulating material or a semiconductive material such as the silicon substrate 1, the handleability during manufacturing of the electroformed components may be improved to increase the manufacturing efficiency. In particular, since the first electroformed components 4A, 4B (the first electroformed component 40) and the second electroformed components 6A, 6B (the second electroformed component 60) may be supported reliably without damage during manufacturing using the metal substrate 10, the manufacturing efficiency of the electroformed components may be improved and the burden on a worker related to the manufacturing may be reduced.

In the manufacturing of the electroformed components according to the method of manufacturing electroformed components of the third embodiment, as is the case with the second embodiment described above, the first electroformed components 4A, 4B may be chamfered at least on the corners of the portions overlapping the second electroformed components 6A, 6B located in the opening 5a before the film for separation for facilitating the separation of the second electroformed components 6A, 6B is formed on the exposed surfaces of the first electroformed components 4A, 4B at the step depicted in FIG. 27. The chamfering in this case may be implemented by performing electrolytic polishing or wet etching for a short time as in the above description.

By chamfering the corners of the first electroformed components 4A, 4B in this way, edges may be eliminated at portions of contact between the first electroformed components 4A, 4B (the first electroformed component 40) and the second electroformed components 6A, 6B (the second electroformed component 60). This makes it possible to distribute stress attributable to the contact between the first electroformed components 4A, 4B (the first electroformed component 40) and the second electroformed components 6A, 6B (the second electroformed component 60), so that the first electroformed components 4A, 4B and the second electroformed components 6A, 6B may be increased in strength and improved in durability.

<Specific Component Manufacturing Examples>

Description will be made of specific component manufacturing examples of the first electroformed components 4A, 4B and the second electroformed components 6A, 6B manufactured by the method of manufacturing electroformed components of the first to third embodiments described above.

(Manufacturing Example of Balance wheel and Weight)

First, a manufacturing example of a balance wheel and a weight incorporated in a mechanical timepiece will be described. In the mechanical timepiece, a speed governor (also referred to as a balance) is formed by combining a balance wheel and a hairspring, and the balance wheel performs a reciprocating rotary motion at a constant cycle due to the force of the hairspring. The balance rocks an anchor according to the reciprocating rotary motion of the balance wheel and sends an escape wheel in to motion one tooth at a time (i.e., rotates it at a constant speed) for timing. The anchor and the escape wheel are also referred to as an escapement.

In the mechanical timepiece, advance or delay of the time indicated by the mechanical timepiece, i.e., a so-called rate, varies depending on the reciprocating motion of the balance wheel. Therefore, the balance wheel has a weight and a moment of inertia prescribed for a predetermined reciprocating motion. In general, an adjustment for achieving the rate of the mechanical timepiece as designed is made using an adjustment mechanism called a regulator pin mounted on the hairspring or by providing a weight around the balance wheel.

Figure 34:
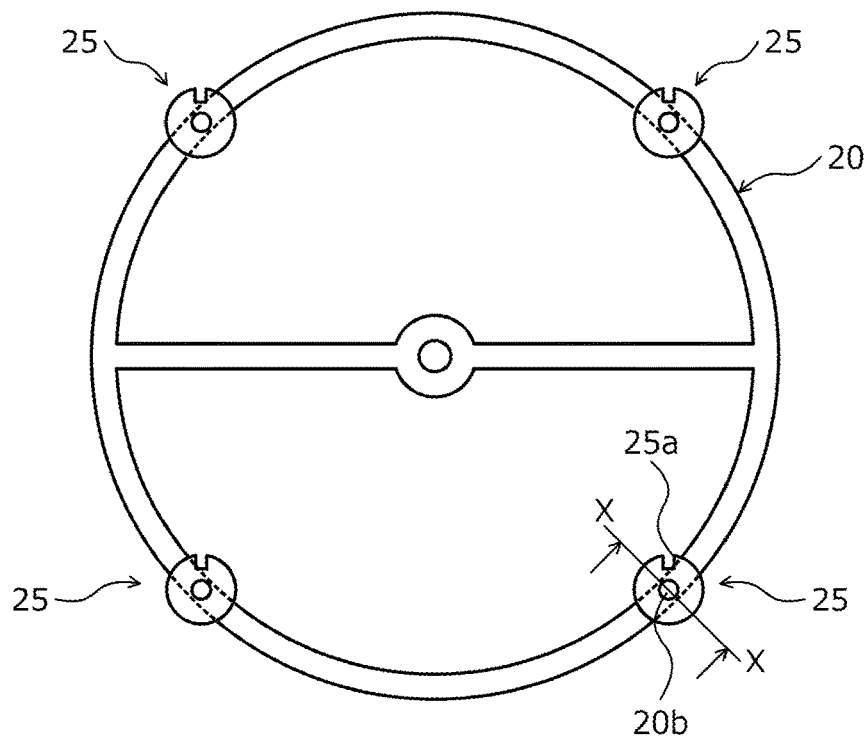
FIG. 34 is an explanatory view (part 1) of an example of a balance wheel and weights mounted on the balance wheel in a mechanical timepiece.
Figure 35:
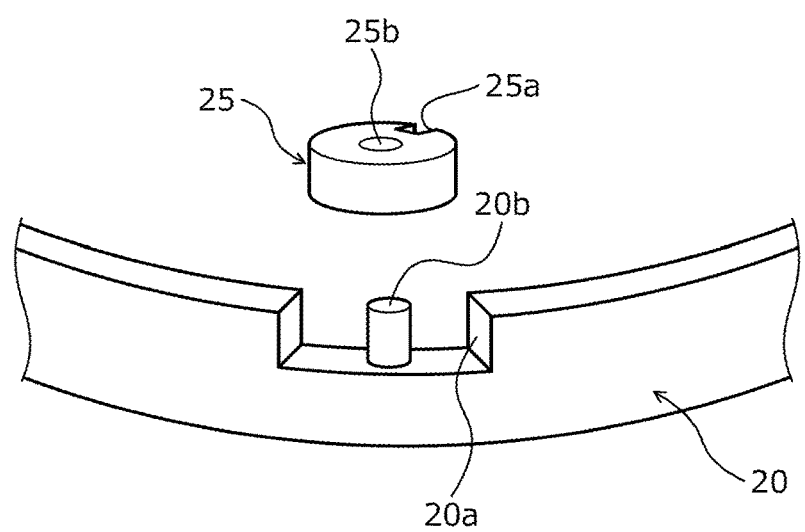
FIG. 35 is an explanatory view (part 2) of the example of the balance wheel and weights mounted on the balance wheel in a mechanical timepiece.

FIGS. 34 and 35 are explanatory views of an example of a balance wheel and weights mounted on the balance wheel in a mechanical timepiece. FIG. 34 depicts a plane view of the weights and the balance wheel on which the weights are mounted. FIG. 35 depicts an enlarged exploded perspective view of a mounting portion of the balance wheel and the weight.

As depicted in FIG. 34, four small disk-shaped weights 25 are mounted at equal angular intervals on the balance wheel 20. As depicted in the enlarged view of FIG. 35, each of weight mounting portions on the upper surface side of the balance wheel 20 has a cutout portion 20a formed having a length slightly longer than the outer diameter of the weight 25 and a depth equivalent to the thickness of the weight 25. A support (support shaft) 20b is integrally formed at the center of a lower step surface of each of the cutout portions 20a. The weights 25 are each provided with a center hole 25b and a cutout portion 25a on an outer circumferential surface. The weights 25 are mounted on the cutout portions 20a of the balance wheel 20 with the center holes 25b fitted to the supports 20b.

The balance wheel 20 and the four weights 25 as described above may be manufactured concurrently in a series of manufacturing steps using the same manufacturing method as the first or third embodiment described above. When the balance wheel 20 and the four weights 25 are manufactured using the same manufacturing method as the first embodiment, the silicon substrate 1 is first prepared that has a size fully accommodating the balance wheels 20 and the four weights 25 when viewed in a direction depicted in FIG. 34. When the balance wheel 20 and the four weights 25 are manufactured using the same manufacturing method as the third embodiment, the metal substrate 10 is first prepared that has a size fully accommodating the balance wheels 20 and the four weights 25 when viewed in the direction depicted in FIG. 34.

Figure 36:
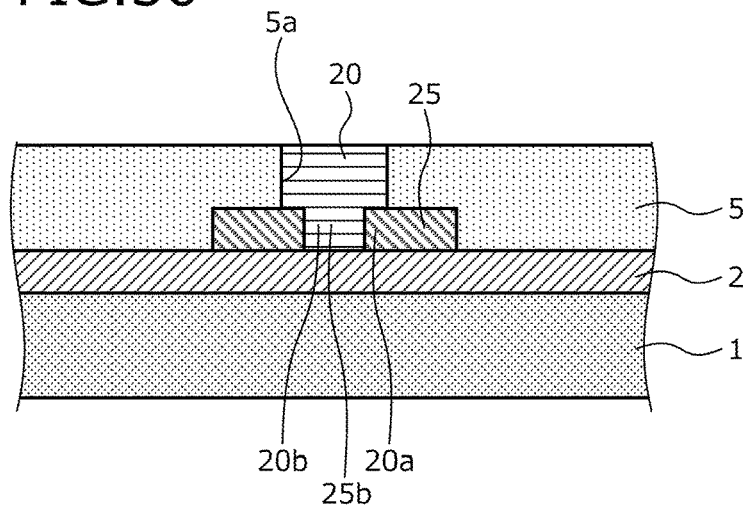
FIG. 36 is an explanatory view (part 1) of a manufacturing example of a balance wheel and a weight mounted on the balance wheel in a mechanical timepiece according to the method of manufacturing electroformed components of the present invention.
Figure 37:
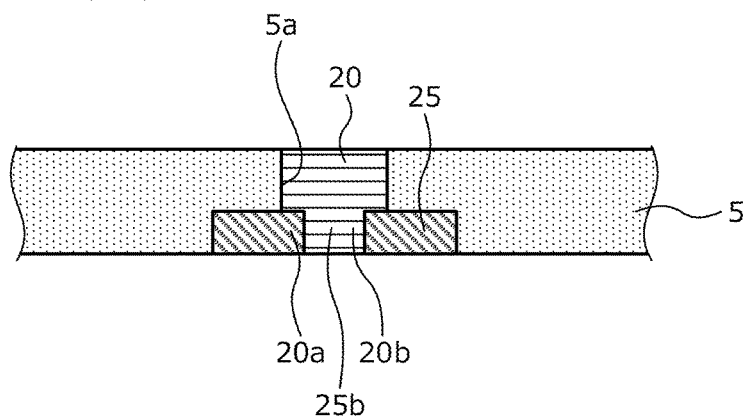
FIG. 37 is an explanatory view (part 2) of the manufacturing example of the balance wheel and the weight mounted on the balance wheel in the mechanical timepiece according to the method of manufacturing electroformed components of the present invention.
Figure 38:
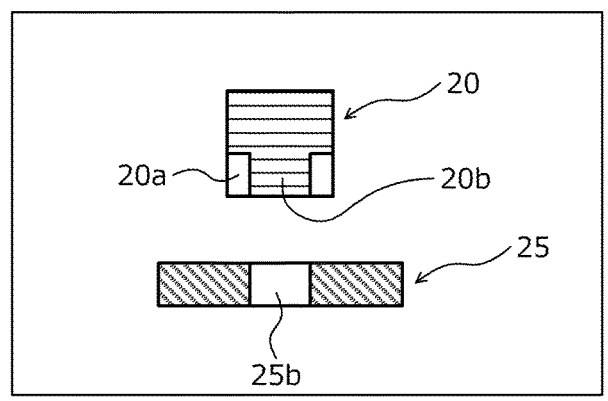
FIG. 38 is an explanatory view (part 3) of the manufacturing example of the balance wheel and the weight mounted on the balance wheel in the mechanical timepiece according to the method of manufacturing electroformed components of the present invention.

FIGS. 36, 37, and 38 are explanatory views of a manufacturing example of a balance wheel and a weight mounted on the balance wheel in a mechanical timepiece according to the method of manufacturing electroformed components of the present invention. FIGS. 36 to 38 depict a portion of a procedure of manufacturing the balance wheel 20 and the weight 25 according to the same manufacturing method as the first embodiment. FIG. 36 corresponds to the step of FIG. 10 in the manufacturing procedure of the first embodiment. FIG. 37 corresponds to the step of FIG. 11 in the manufacturing procedure of the first embodiment. FIG. 38 corresponds to the step of FIG. 13 in the manufacturing procedure of the first embodiment. FIGS. 36 to 38 depict the balance wheel 20 and the weight 25 in a portion corresponding to a cross-section taken along a line X-X of FIG. 34. In FIGS. 36 to 38, portions identical to those of the first to third embodiments described above are denoted by the same reference characters used in the first to third embodiments and will not be described.

In the manufacturing of the balance wheel 20 and the weight 25, the small disk-shaped weight 25 having the center hole 25b is regarded as the first electroformed component and the balance wheel 20 is regarded as the second electroformed component. First, in the same way as the steps depicted in FIGS. 1 to 4, 6, and 7 described above, the conductive layer 2 is formed on the front surface side of the silicon substrate 1, and the weight 25 is formed on the front surface side of the conductive layer 2. A film for separation for facilitating the separation of the balance wheel 20 is formed on an exposed surface of the weight 25.

Subsequently, in the same way as the step depicted in FIG. 8, the second photoresist layer 5 is formed on the front surface side of the conductive layer 2 and a portion of the front surface side of the weight 25, and the second photoresist layer 5 is patterned to form the opening 5a corresponding to the planar shape of the balance wheel 20 partially overlapping the weight 25. In the same way as the step depicted in FIG. 9, the second electroformed member 6 is deposited on the front surface side of the conductive layer 2 and the front surface side of the weight 25 in the opening 5a of the second photoresist layer 5.

Subsequently, as depicted in FIG. 36, the second electroformed member 6 and the second photoresist layer 5 are planarized on the front surface side by grinding to form the balance wheel 20. The positional relationship between the balance wheel 20 and the weight 25 of FIG. 36 is inverted from the positional relationship between the balance wheel 20 and the weight 25 of FIG. 35. In the state depicted in FIG. 36, the support 20b of the balance wheel 20 enters the center hole 25b of the weight 25, and the cutout portion 20a overlaps with the weight 25.

As depicted in FIG. 37, the silicon substrate 1 and the conductive layer 2 are then ground from the back surface side of the silicon substrate 1 to remove the silicon substrate 1 and the conductive layer 2 from the weight 25 and the balance wheel 20. Subsequently, when the photoresist layer 5 is removed, the balance wheel 20 and the weight 25 may be separated easily without damage and may be taken out individually as depicted in FIG. 38 consequent to the film for separation for facilitating the separation of the balance wheel 20.

As described above, according to the method of manufacturing electroformed components of the present invention, the weight 25, which is a flat-plate component, and the balance wheel 20, which is a stepped component having the cutout portion 20a, may be accurately manufactured concurrently in a series of steps. Even when the metal substrate 10 described in the third embodiment is used instead of the silicon substrate 1 and the conductive layer 2, the balance wheel 20 and the weight 25 may be accurately manufactured concurrently in a series of steps as described above.

(Manufacturing Example of Gear and Bearing)

Figure 39:
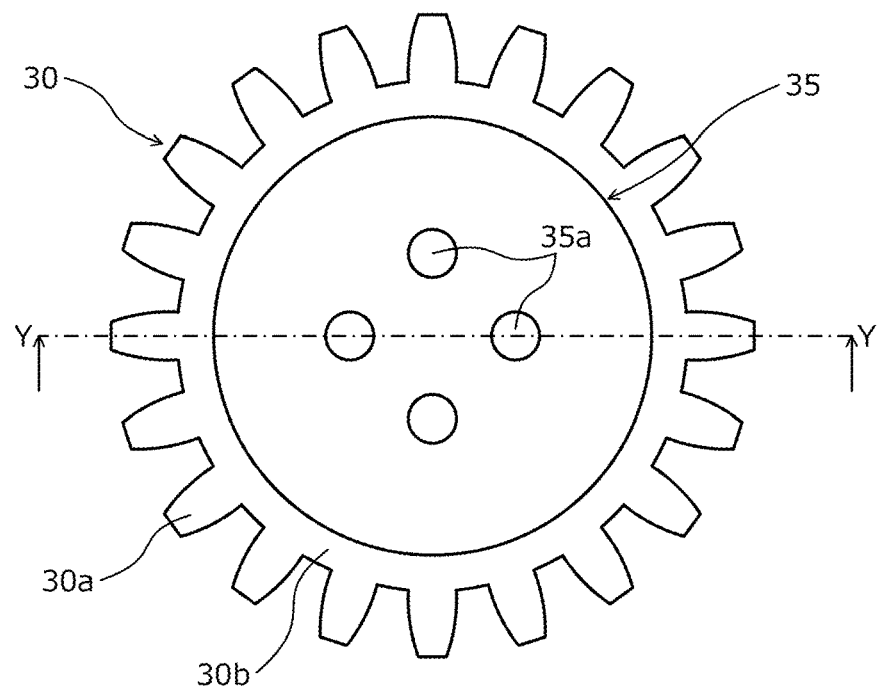
FIG. 39 is a plane view of a fitted state of a gear and a bearing.

A manufacturing example of a gear and a bearing incorporated in a mechanical timepiece will be described. Numerous gears are used in a mechanical timepiece. A gear is supported by a bearing such that the gear may rotate relative to the bearing. FIG. 39 is a plane view of a fitted state of a gear and a bearing.

As depicted in FIG. 39, a gear 30 includes an annular portion 30b having an annular shape and multiple teeth 30a radially projecting from the annular portion 30b on an outer circumferential portion of the annular portion 30b. The multiple teeth 30a radially project at a constant pitch on the outer circumference of the annular portion 30b. The gear 30 has a circular opening (see reference character 30c of FIGS. 40 to 42) provided inside the annular portion 30b so that the bearing 35 is fitted therein. The bearing 35 is fitted into the gear 30 in a state enabling relative rotation. The bearing 35 has four locking holes 35a formed at an equal distance from the center at equal angular intervals. The bearing 35 is fixed to a support plate, etc. by screws or pins inserted into the locking holes 35a.

The gear 30 and the bearing 35 as described above may be manufactured concurrently in a series of manufacturing steps using the same manufacturing method as the second embodiment described above. When the gear 30 and the bearing 35 are manufactured using the same manufacturing method as the second embodiment, the silicon substrate 1 is first prepared that has a size fully accommodating the gear 30 and the bearing 35 when viewed in a direction indicated by arrows in FIG. 39. The gear 30 and the bearing 35 may be manufactured concurrently in a series of manufacturing steps even when the same manufacturing method as the first or third embodiment described above is used.

Figure 40:
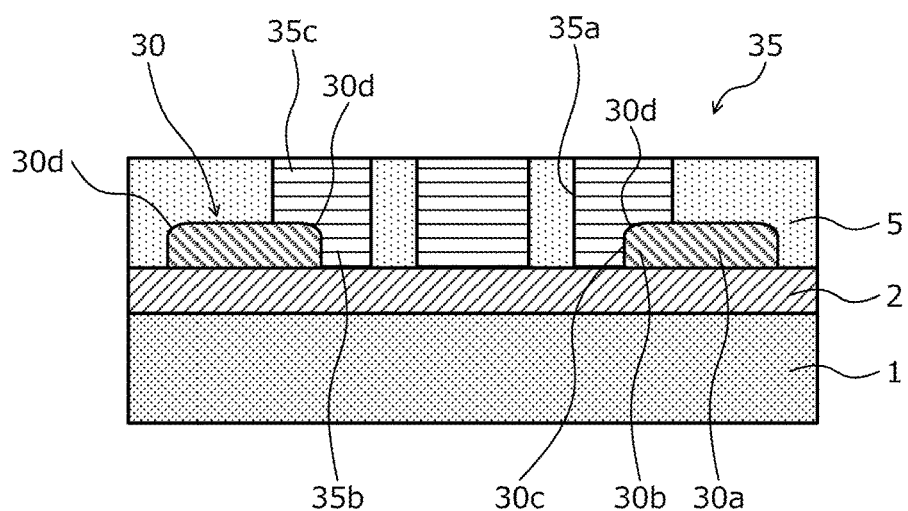
FIG. 40 an explanatory view (part 1) of a manufacturing example of a gear and a bearing in a mechanical timepiece according to the method of manufacturing electroformed components of the present invention.
Figure 41:
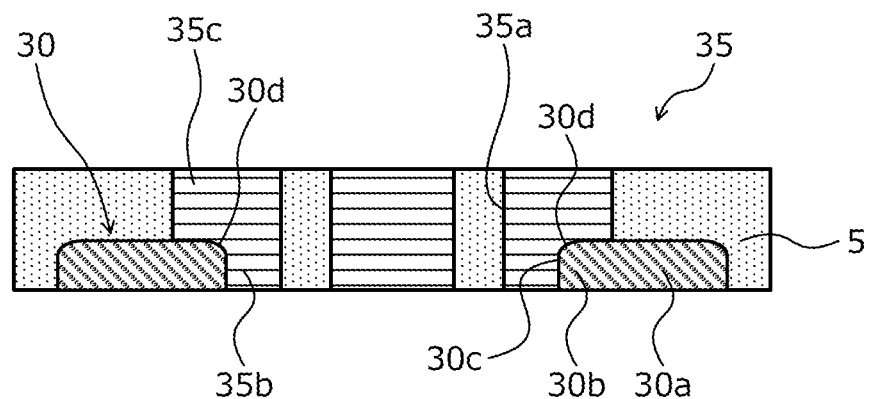
FIG. 41 is an explanatory view (part 2) of the manufacturing example of the gear and the bearing in the mechanical timepiece according to the method of manufacturing electroformed components of the present invention.
Figure 42:
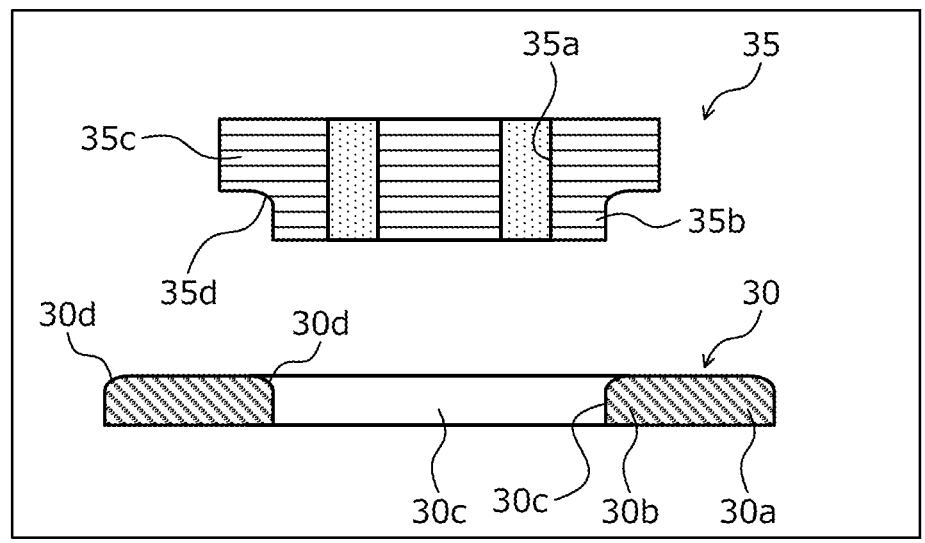
FIG. 42 is an explanatory view (part 3) of the manufacturing example of the gear and the bearing in the mechanical timepiece according to the method of manufacturing electroformed components of the present invention.

FIGS. 40, 41, and 42 are explanatory views of a manufacturing example of the gear 30 and the bearing 35 in the mechanical timepiece according to the method of manufacturing electroformed components of the present invention. FIGS. 40 to 42 depict a portion of a procedure of manufacturing the gear 30 and the bearing 35 according to the same manufacturing method as the second embodiment. FIG. 40 corresponds to the step of FIG. 19 in the manufacturing procedure of the second embodiment. FIG. 41 corresponds to the step of FIG. 20 in the manufacturing procedure of the second embodiment. FIG. 42 corresponds to the step of FIG. 22 in the manufacturing procedure of the second embodiment. FIGS. 40 to 42 depict the gear 30 and the bearing 35 in a portion corresponding to a cross-section taken along a line Y-Y of FIG. 39. In FIGS. 40 to 42, portions identical to those of the first to third embodiments described above are denoted by the same reference characters used in the first to third embodiments and will not be described.

In the manufacture of the gear 30 and the bearing 35, the gear 30 is regarded as the first electroformed component and the bearing 35 is regarded as the second electroformed component. First, in the same way as the steps depicted in FIGS. 1 to 4, 6, and 7 described above, the conductive layer 2 is formed on the front surface side of the silicon substrate 1, and the gear 30 is formed on the front surface side of the conductive layer 2.

Subsequently, in the same way as the step depicted in FIG. 16, the gear 30 is chamfered (rounded) at least on corners of portions in contact with the bearing 35 to form chamfered portions 30d. The chamfered portions 30d are formed on an upper edge (an edge on the front surface side) of the circular opening 30c of the gear 30 and upper end edges (edges on the front surface side) of leading ends of the teeth 30a. A film for separation for facilitating the separation of the bearing 35 is formed on an exposed surface of the gear 30.

Subsequently, in the same way as the step depicted in FIG. 17, the second photoresist layer 5 is formed on the front surface side of the conductive layer 2 and a portion of the front surface side of the gear 30, and the second photoresist layer 5 is patterned to form the opening 5a corresponding to the planar shape of the bearing 35 partially overlapping with the gear 30. In the same way as the step depicted in FIG. 18, the second electroformed member 6 is deposited on the front surface side of the conductive layer 2 and the front surface side of the gear 30 in the opening 5a of the second photoresist layer 5.

Subsequently, as depicted in FIG. 40, the second electroformed member 6 and the second photoresist layer 5 are planarized on the front surface side to form the bearing 35. The bearing 35 has a small diameter portion 35b fitted into the circular opening 30c of the gear 30 and a large diameter portion 35c overlapping the gear 30. In this state, since an inner corner of a stepped portion made up of the small diameter portion 35b and the large diameter portion 35c of the bearing 35 is in contact with the chamfered portion 30d of the gear 30, the chamfered shape (rounded shape) of the chamfered portion 30d is transferred, so that corner portion 35d is formed into a concave curve or slope shape.

As depicted in FIG. 41, the silicon substrate 1 and the conductive layer 2 are then ground from the back surface side of the silicon substrate 1 to remove the silicon substrate 1 and the conductive layer 2 from the gear 30 and the bearing 35. Subsequently, when the photoresist layer 5 is removed, the gear 30 and the bearing 35 may be separated easily without damage and may be taken out individually as depicted in FIG. 42 because of the film for separation for facilitating the separation of the bearing 35.

As described above, according to the method of manufacturing electroformed components of the present invention, the gear 30, which is a flat-plate component, and the bearing 35, which is a stepped component made up of the small diameter portion 35b and the large diameter portion 35C, may be accurately manufactured concurrently in a series of steps. Furthermore, according to the method of manufacturing electroformed components of the present invention, since the chamfered portion 30d is provided on the gear 30, the surfaces allowing the gear 30 and the bearing 35 to rotate relative to and in contact with each other may be formed accurately.

Additionally, according to the method of manufacturing electroformed components of the present invention, since a local concentration of stress due to contact between the gear 30 and the bearing 35 may be eliminated to distribute the stress by providing the chamfered portion 30d on the gear 30, the gear 30 and the bearing 35 may be increased in strength and improved in durability.

In manufacturing of the gear 30 and the bearing 35, the metal substrate 10 described in the third embodiment may be used instead of the silicon substrate 1 and the conductive layer 2 as described above. As a result, as is the case with the gear 30 and the bearing 35 described above, the gear 30 and the bearing 35 may be accurately manufactured concurrently in a series of steps and may be improved in durability.

(Manufacturing Example of Escape Wheel and Flat-plate Small Components)

Figure 43:
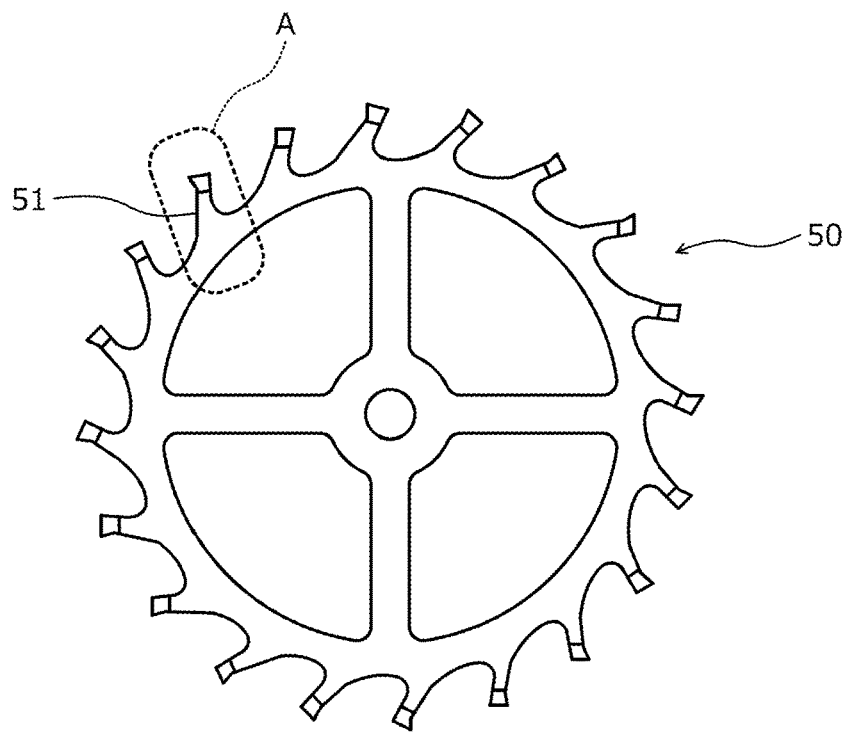
FIG. 43 is a plane view of an escape wheel.

A manufacturing example of an escape wheel and flat-plate small components incorporated in a mechanical timepiece will be described. The mechanical timepiece includes an escape wheel. FIG. 43 is a plane view of the escape wheel. As depicted in FIG. 43, the escape wheel 50 has an annular shape. On the outer circumference of the escape wheel 50, multiple tooth portions 51 are provided at a constant pitch. The tooth portions 51 are obliquely provided at a constant angle relative to the radiation direction (radial direction) of the annular shape formed by the escape wheel 50.

In the mechanical timepiece, the escape wheel 50 is sent by one tooth at a time by the anchor rocked according to the reciprocating rotary motion of the balance wheel, and intermittently rotates at a constant speed. The anchor has anchor pallet stones engaged with the tooth portions 51 of the escape wheel 50 so as to rotate the escape wheel 50. The escape wheel 50 is provided at the end of a wheel train from a barrel rotated by a mainspring.

Figure 44:
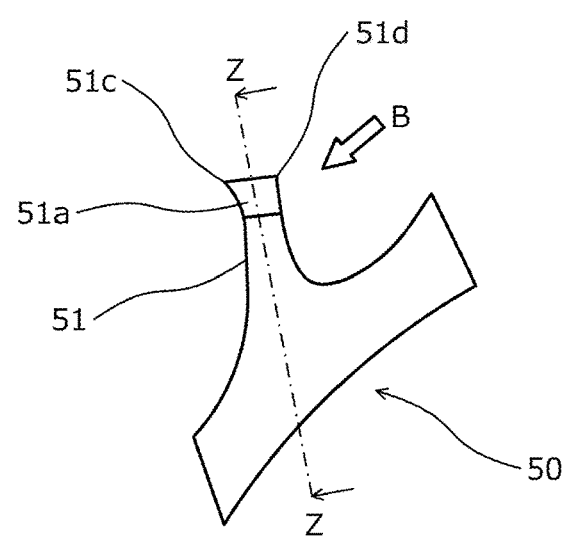
FIG. 44 is a partial enlarged plane view of a portion surrounded by an oval A indicated by a broken line of FIG. 43.
Figure 45:
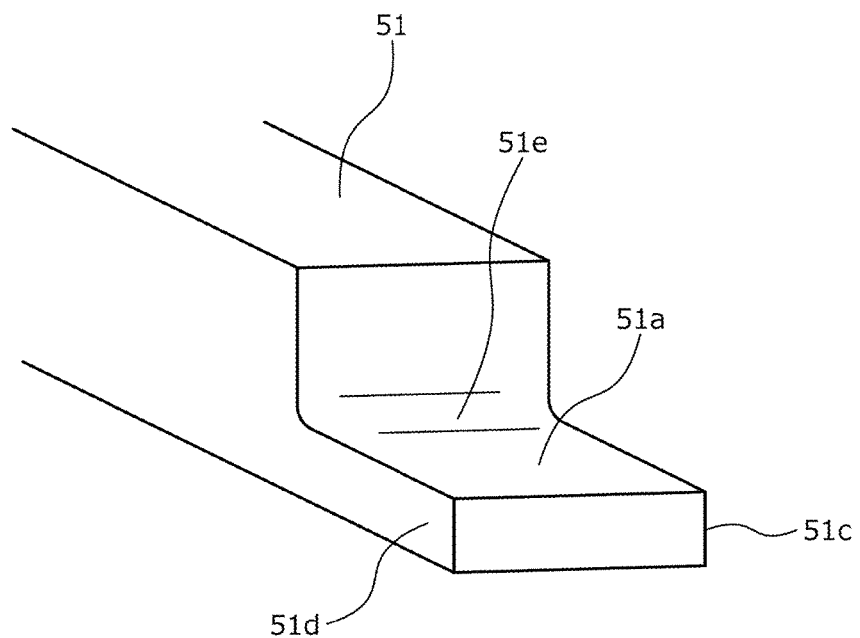
FIG. 45 is a partial enlarged plane view of a portion viewed in a direction of an arrow B of FIG. 44.

FIG. 44 is a partial enlarged plane view of a portion surrounded by an oval A indicated by a broken line of FIG. 43. FIG. 45 is a partial enlarged plane view of a portion viewed in a direction of an arrow B of FIG. 44. As depicted in FIGS. 44 and 45, a leading end portion of the tooth portion 51 is formed into a stepped shape by reducing the thickness on the leading end side. A thin portion 51a having a reduced thickness is provided at an outmost end of the leading end portion of the tooth portion 51.

One side surface of the thin portion 51a has a leading end forming a leaving corner 51c slightly projecting laterally (outward), and a leading end (corner) of the other side surface forms a locking corner 51d. A leaving corner of an entry pallet held at one end portion of the anchor hits the leaving corner 51c of the tooth portion 51 of the escape wheel 50, and a locking corner of an exit pallet held at the other end portion of the anchor hits the locking corner 51d of the tooth portion 51.

In the leading end portion of the tooth portion 51, a corner portion 51e having an L shape due to a change in thickness in a stepped portion formed by providing the thin portion 51a is formed into a concave curve (rounded shape). By forming the corner portion 51e into a concave curve (rounded shape) in this way, the stress at the corner portion 51e may be distributed to increase the strength as compared to when the corner of the stepped portion has the right angle (90 degrees) instead of the concave curve (rounded shape). Additionally, by forming the thin portion 51a with roundness in the leading end portion of the tooth portion 51 of the escape wheel 50, a function of an oil reservoir may be given to prevent wear due to abutting on the anchor pallet stone.

FIGS. 46, 47, 48, 49, and 50 are explanatory views of a manufacturing example of the escape wheel 50 and the flat-plate small component in the mechanical timepiece according to the method of manufacturing electroformed components of the present invention. FIGS. 46 to 50 depict a portion of a procedure of manufacturing the escape wheel 50 and a flat-plate small component 45 manufactured in a series of manufacturing steps related to the manufacturing of the escape wheel 50.

Figure 46:
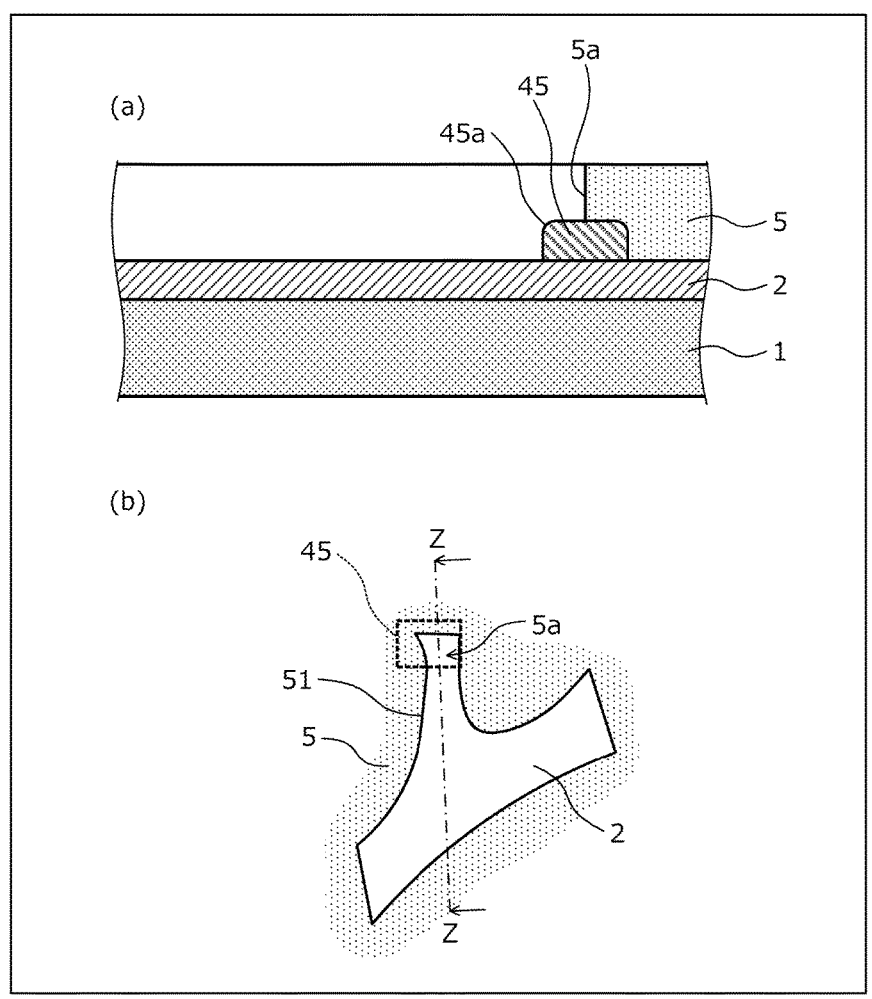
FIG. 46 is an explanatory view (part 1) of a manufacturing example of the escape wheel and a flat-plate small component in a mechanical timepiece according to the method of manufacturing electroformed components of the present invention.
Figure 47:
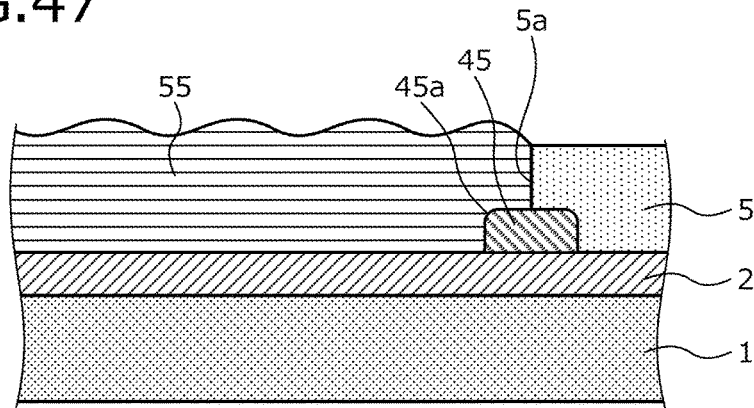
FIG. 47 is an explanatory view (part 2) of the manufacturing example of the escape wheel and the flat-plate small component in the mechanical timepiece according to the method of manufacturing electroformed components of the present invention.
Figure 48:
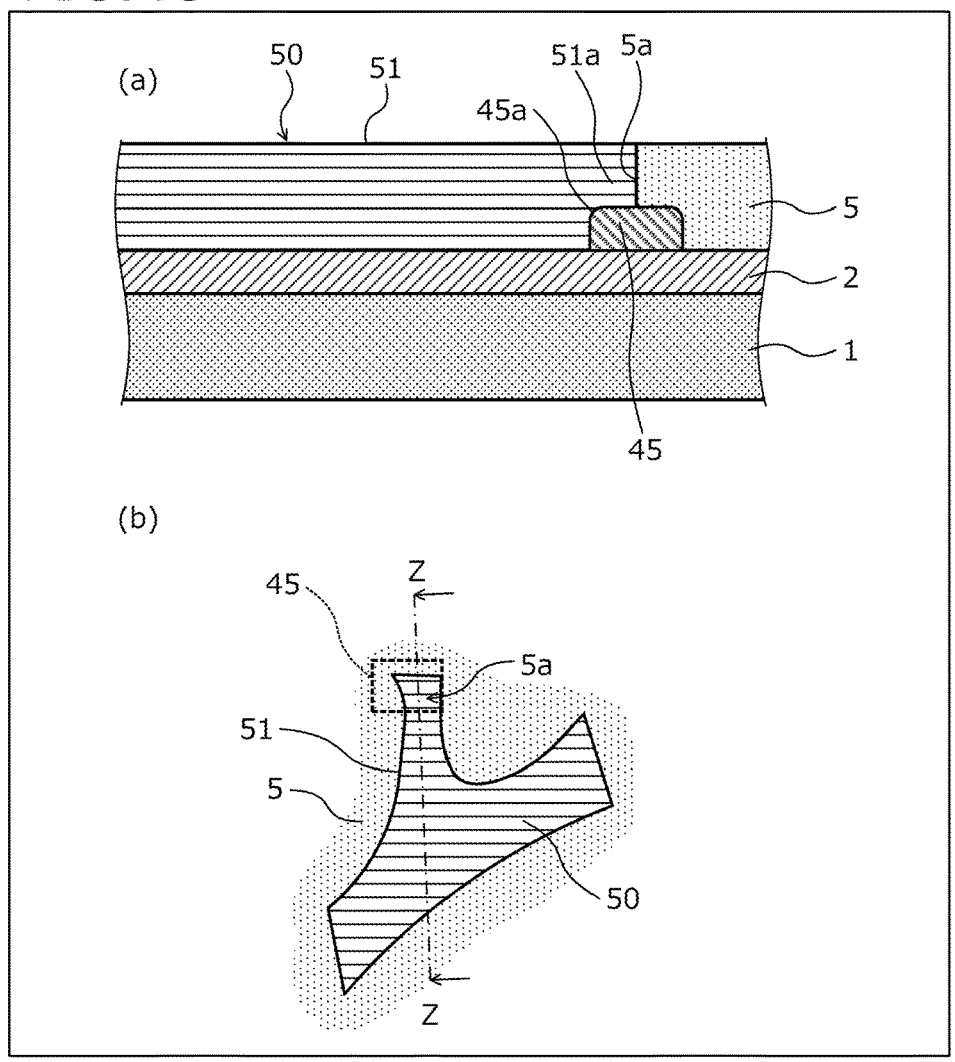
FIG. 48 is an explanatory view (part 3) of the manufacturing example of the escape wheel and the flat-plate small component in the mechanical timepiece according to the method of manufacturing electroformed components of the present invention.
Figure 49:
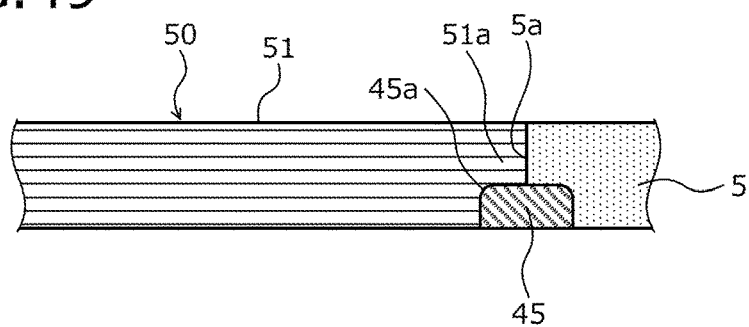
FIG. 49 is an explanatory view (part 4) of the manufacturing example of the escape wheel and the flat-plate small component in the mechanical timepiece according to the method of manufacturing electroformed components of the present invention.

FIGS. 46(a), 47, 48(a), 49, and 50(a) depict a portion of a procedure of manufacturing the escape wheel 50 and the flat-plate small component according to the same manufacturing method as the second embodiment. In FIG. 46, (a) corresponds to the step of FIG. 17 in the manufacturing procedure of the second embodiment. FIG. 47 corresponds to the step of FIG. 18 in the manufacturing procedure of the second embodiment. In FIG. 48, (a) corresponds to the step of FIG. 19 in the manufacturing procedure of the second embodiment. FIG. 49 corresponds to the step of FIG. 20 in the manufacturing procedure of the second embodiment. In FIG. 50, (a) corresponds to the step of FIG. 22 in the manufacturing procedure of the second embodiment.

FIGS. 46(a), 47, 48(a), 49, and 50(a) depict the escape wheel 50 and the flat-plate small component in a portion corresponding to a cross-section taken along a line Z-Z of FIG. 44. In FIGS. 46, 48, and 50, (b) depicts a state of the front surface side viewed from the conductive layer 2 side at the steps depicted in FIGS. 46(a), 48(a), and 50(a), respectively. In each of FIGS. 46(b) and 48(b), the flat-plate small component 45 is indicated by a dotted line. In FIGS. 46 to 50, portions identical to those of the first to third embodiments described above are denoted by the same reference characters used in the first to third embodiments and will not be described.

In the manufacture of the escape wheel 50 and the flat-plate small component 45 according to the method of manufacturing electroformed components of the present invention, the flat-plate small component 45 is regarded as the first electroformed component and the escape wheel 50 is regarded as the second electroformed component. For example, in the manufacture of the escape wheel 50 and the flat-plate small component 45 according to the method of manufacturing electroformed components of the present invention, first, in the same way as the steps depicted in FIGS. 1 to 4 and 6 described above, the first electroformed member 4 and the first photoresist layer 3 are planarized on the front surface side to form the flat-plate small component 45.

In the manufacture of the escape wheel 50 and the flat-plate small component 45, the flat-plate small component 45 functions as a nest. Corners of the flat-plate small component 45 are then chamfered (rounded). This chamfering is performed at least on the corners of the flat-plate small component 45 located in the opening 5a. The film for separation for facilitating the separation of the escape wheel 50 is formed on an externally exposed surface that is the surface of the flat-plate small component 45.

Subsequently, as depicted in FIG. 46, the second photoresist layer 5 is formed on the front surface side of the conductive layer 2, and the second photoresist layer 5 is patterned to form the opening (second through-hole) 5a in the second photoresist layer 5. As depicted in FIG. 47, electroforming is performed using the conductive layer 2 as one of the electrodes as is the case with the second embodiment described above until a second electroformed member 55 is formed having such a thickness allowing the member to somewhat project and rise from the surface of the second photoresist layer 5.

Subsequently, as depicted in FIG. 48, the second electroformed member 55 and the second photoresist layer 5 are planarized on the front surface side by grinding to form the escape wheel 50. In the state depicted in FIG. 48, the thin portion 51a of the tooth portion 51 of the escape wheel 50 is in close contact with and overlaps the small component 45. The corner portion 51e forming the step portion in the tooth portion 51 is in contact with the chamfered portion 45a of the flat-plate small component 45, and the chamfered shape (rounded shape) of the chamfered portion 45a is transferred to the corner portion 51e, so that the same concave curve is formed.

Figure 50:
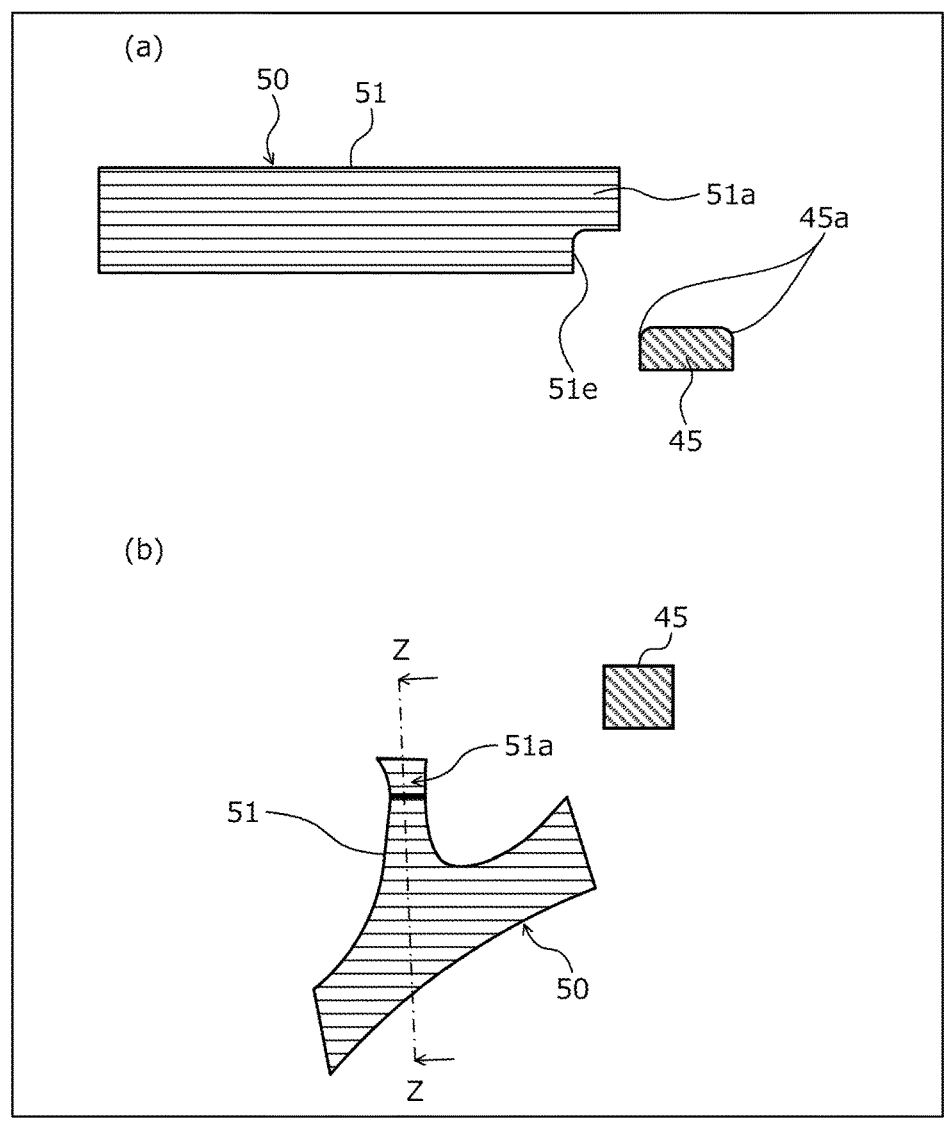
FIG. 50 is an explanatory view (part 5) of the manufacturing example of the escape wheel and the flat-plate small component in the mechanical timepiece according to the method of manufacturing electroformed components of the present invention.

As depicted in FIG. 49, the silicon substrate 1 and the conductive layer 2 are then ground from the back surface side of the silicon substrate 1 to remove the silicon substrate 1 and the conductive layer 2 from the escape wheel 50 and the flat-plate small component 45. Subsequently, when the photoresist layer 5 is removed, the escape wheel 50 and the flat-plate small component 45 may be separated easily without damage and may be taken out individually as depicted in FIG. 50 because of the film for separation for facilitating the separation of the escape wheel 50.

As described above, according to the method of manufacturing electroformed components of the present invention, the escape wheel 50, which is a stepped component, and the small component 45, which is a flat-plate component, may be accurately manufactured concurrently in a series of steps. Even when the metal substrate 10 described in the third embodiment is used instead of the silicon substrate 1 and the conductive layer 2, the escape wheel 50 and the flat-plate small component 45 may accurately be manufactured concurrently in a series of steps.

According to the method of manufacturing electroformed components of the present invention, the chamfered shape (rounded shape) of the chamfered portion 45a provided on the flat-plate small component 45 is transferred to the corner portion 51e to manufacture the escape wheel 50 that is the stepped component. As a result, since the local concentration of stress due to contact of the anchor pallet stones with the escape wheel 50 may be eliminated to distribute the stress, the thin portion 51a may be increased in strength and improved in durability. Therefore, the durability of the escape wheel 50 may be improved.

Furthermore, according to the method of manufacturing electroformed components of the present invention, the second electroformed member 6 deposited on the flat-plate small component 45 may be ground along with the second photoresist layer 5 to form the thin part 51a in the leading end portion of the tooth portion 51. As a result, since the thin portion 51a may be formed without applying processing such as grinding to the leading end portion of the tooth portion 51, the escape wheel 50 may be prevented from being damaged during manufacturing. As a result, the manufacturing efficiency of the escape wheel 50 may be improved.

The flat-plate small component 45 manufactured in a series of manufacturing steps according to the manufacturing of the escape wheel 50 may be changed to an arbitrary planar shape. By adjusting the shape of the flat-plate small component 45, the flat-plate small component 45 may be formed as various components such as a scale piece affixed or fitted to a dial of a timepiece and the weight 25 mounted on the balance wheel 20 described above.

(Manufacturing Example of Rotor Shaft)

Figure 51:
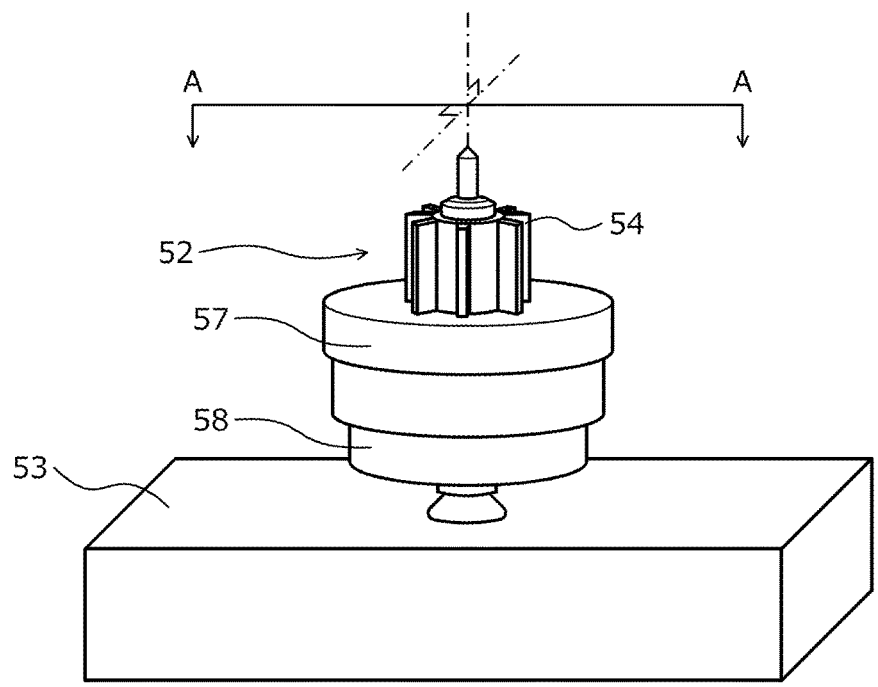
FIG. 51 is an explanatory view (part 1) of a portion of a rotor.
Figure 52:
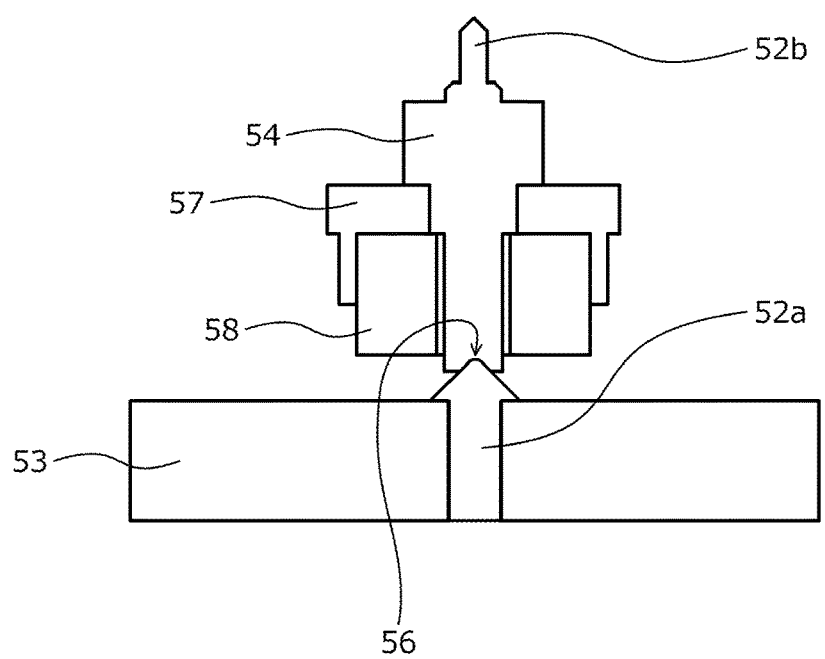
FIG. 52 is an explanatory view (part 2) of the portion of the rotor.
Figure 53:
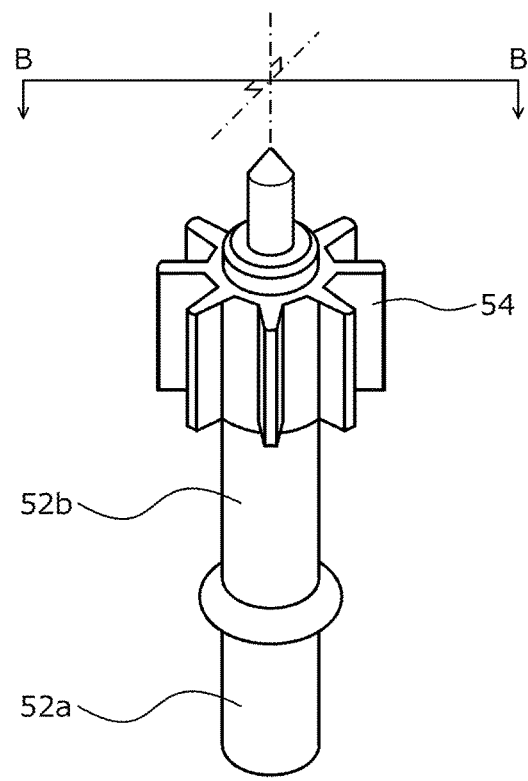
FIG. 53 is an explanatory view (part 1) of a rotor shaft included in the rotor.
Figure 54:
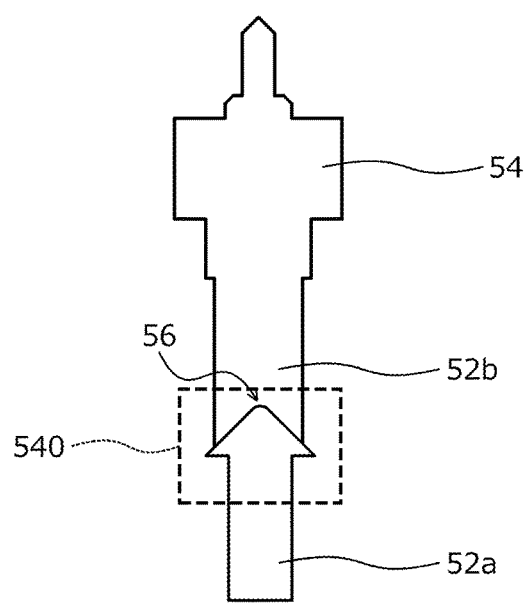
FIG. 54 is an explanatory view (part 2) of the rotor shaft included in the rotor.

A manufacturing example of a rotor shaft incorporated in a quartz type timepiece, etc. will be described. FIGS. 51 and 52 are explanatory views of a portion of a rotor. FIG. 52 depicts a cross-section of a portion of the rotor depicted in FIG. 51 taken along a plane passing through a line A-A. FIGS. 53 and 54 are explanatory views of a rotor shaft included in the rotor. FIG. 54 depicts a cross-section of the rotor shaft depicted in FIG. 53 taken along a plane passing through a line B-B.

As depicted in FIGS. 51 to 54, a rotor shaft 52b included in the rotor has one end side supported by a rotor bearing 52a and is provided enabling rotation around an axis center. The rotor bearing 52a is fixed to a bottom plate 53 holding a coil. The rotor shaft 52b is provided enabling rotation relative to the rotor bearing 52a.

A rotor pinion 54 is provided on the other end side of the rotor shaft 52b. The rotor shaft 52b includes a rotor magnet 58 provided between the bottom plate 53 and the rotor pinion 54. The rotor magnet 58 is held by a rotor magnet holding member 57. The rotor magnet holding member 57 is fitted to the rotor shaft 52b while holding the rotor magnet 58.

The rotor bearing 52a has a chamfered portion 56 formed at an end portion facing the rotor shaft 52b. The chamfered portion 56 is chamfered (rounded) such that the side closer to the axial center of the rotor shaft 52b is more protruded toward the rotor shaft 52b than the outer circumferential side, and has a chamfered shape (rounded shape). The rotor shaft 52b has a recess (without reference number) corresponding to the chamfered shape (rounded shape) of the chamfered portion 56 provided at the end facing the rotor bearing 52a. The rotor bearing 52a and the rotor shaft 52b are brought into contact with each other by bringing the chamfered portion 56 and the recess into contact with each other.

The rotor bearing 52a and the rotor shaft 52b as described above may be manufactured concurrently in a series of manufacturing steps using the same manufacturing method as the second embodiment described above, for example. In the manufacturing of the rotor bearing 52a and the rotor shaft 52b using the same manufacturing method as the second embodiment, the rotor bearing 52a is regarded as the first electroformed component and the rotor shaft 52b is regarded as the second electroformed component.

For example, in the manufacturing of the rotor bearing 52a and the rotor shaft 52b using the same manufacturing method as the second embodiment, first, in the same way as the steps depicted in FIGS. 1 to 4, 6, and 7 described above, the conductive layer 2 is formed on the front surface side of the silicon substrate 1, and the rotor bearing 52a is formed on the front surface side of the conductive layer 2. Subsequently, in the same way as the step depicted in FIG. 16, the rotor bearing 52a is chamfered (rounded) at least in a portion (leading end portion) brought into contact with the rotor shaft 52b so as to form a chamfered portion. A film for separation for facilitating the separation of the rotor shaft 52b is then formed on an exposed surface of the rotor bearing 52a.

Subsequently, in the same way as the step depicted in FIG. 17, the second photoresist layer 5 is formed on the front surface side of the conductive layer 2 and a portion of the front surface side of the rotor bearing 52a, and the second photoresist layer 5 is patterned to form the opening 5a corresponding to the planar shape of the rotor shaft 52b overlapping the rotor bearing 52a. In the same way as the step depicted in FIG. 18, the second electroformed member 6 is deposited on the front surface side of the conductive layer 2 and the front surface side of the rotor bearing 52a in the opening 5a of the second photoresist layer 5.

For example, by separately forming the rotor shaft 52b and the rotor pinion 54, the opening 5a (the second electroforming mold 8) related to shaping of the rotor shaft 52b may be formed using photoresist. Alternatively, by forming the second photoresist layer 5 multiple times and adjusting the patterning shape of each of the second photoresist layers 5, the rotor shaft 52b including a stepped portion such as the rotor pinion 54 may be formed using photoresist.

In the rotor bearing 52a, at least the portion (leading end portion) brought into contact with the rotor shaft 52b is chamfered (rounded) into the chamfered portion and thus, the end portion of the rotor shaft 52b facing the rotor bearing 52a has a concave curve (or cone shape) because the chamfered portion is transferred.

The second electroformed member 6 and the second photoresist layer 5 are then ground on the front surface side by a predetermined amount to shape the second electroformed member 6 so as to form the rotor shaft 52b. Subsequently, the second photoresist layer 5 is removed to form the rotor bearing 52a and the rotor shaft 52b.

As described above, according to the method of manufacturing electroformed components of the present invention, the rotor bearing 52a fixed to the bottom plate and the rotor shaft 52b rotatable relative to the rotor bearing 52a may be accurately manufactured concurrently in series of steps. According to the method of manufacturing electroformed components of the present invention, by providing the chamfered portion at the leading end portion of the rotor bearing 52a, stress may be prevented from locally concentrating at the contact portion between the rotor bearing 52a and the rotor shaft 52b so as to reduce wear between the rotor bearing 52a and the rotor shaft 52b. As a result, a reduction may be achieved in power consumption of a motor.

In the manufacturing of the rotor shaft and the rotor bearing, the rotor shaft and the rotor bearing may be manufactured entirely by the method of manufacturing electroformed components according to the present invention as described above, or a joint portion with the rotor shaft 52b (a contact portion: see reference character 540 in FIG. 54) in the rotor bearing 52a alone may be manufactured by the method of manufacturing electroformed components according to the present invention.

For example, "a portion in contact with the rotor shaft 52b and a peripheral portion thereof in the rotor bearing 52a" and "a portion in contact with the rotor bearing 52a and a peripheral portion thereof in the rotor shaft 52b" alone may be manufactured using the LIGA method. For example, in the rotor bearing 52a and the rotor shaft 52b, the portion surrounded by the dotted frame 540 of FIG. 54 alone may be manufactured using the LIGA method. When a component to be manufactured is manufactured using the LIGA method limitedly to a portion of mutual contact as described above, another portion (shaft) forming an elongated shaft shape is separately manufactured in advance, and the separately manufactured portion (shaft) is jointed to the portion manufactured using the LIGA method so as to form the rotor bearing 52a or the rotor shaft 52b.

Alternatively, when a component forming an elongated shaft shape such as the rotor bearing 52a and the rotor shaft 52b is manufactured using the LIGA method, for example, one of the rotor bearing 52a and the rotor shaft 52b may be manufactured using the LIGA method only in a portion brought into contact with the other and a peripheral portion thereof.

In the case of manufacturing a whole of a component forming an elongated shaft shape such as the rotor bearing 52a and the rotor shaft 52b using the LIGA method, a dimension in the thickness direction of deposition of the first electroformed member 4 and the second electroformed member 6 is large with respect to an area of the conductive layer 2 serving as an electrode in electroforming. Consequently, it takes a long time to deposit the first electroformed member 4 and the second electroformed member 6 to an intended thickness. In this regard, by manufacturing a component to be manufactured using the LIGA method limitedly to the mutual contact portion as described above, closely contacting or abutting portions of components at least partially in close contact with or abutting each other may be accurately manufactured concurrently in a series of manufacturing steps. As a result, when incorporated as a product, the components may be accurately brought into close contact with or abut each other without a gap or causing rattle therebetween.

(Manufacturing Example of Gear and Bearing)

A manufacturing example of a gear and a bearing incorporated in a mechanical timepiece, a quartz type timepiece, etc. will be described. Generally, the gear (not depicted) is configured to include a gear portion having a substantially disk-shape and including teeth projecting radially on an outer circumferential portion, and a gear shaft provided at a center of rotation of the gear portion. The bearing (not depicted) holds both ends of a gear shaft of the gear so as to enable rotation. The gear rotates relative to the bearing at a position defined by the bearing.

In manufacturing of the gear and the bearing according to the method of manufacturing electroformed components of the present invention, the gear (gear shaft) is regarded as the first electroformed component and the bearing is regarded as the second electroformed component. For example, in the manufacturing of the gear and the bearing according to the method of manufacturing electroformed components of the present invention, first, in the same way as the steps depicted in FIGS. 1 to 4 and 6 described above, the gear (gear shaft), which is the first electroformed component, is formed. An end portion of the gear shaft is then chamfered (rounded) to form a chamfered portion.

A film for separation for facilitating the separation of the bearing is then formed on a chamfered-shaped (round-shaped) surface of the chamfered portion in the end portion of the gear shaft. In the same way as the steps depicted in FIGS. 17 to 20, after the second electroformed member 6 serving as the bearing is deposited to cover the chamfered shape (rounded shape) of the end portion of the gear shaft, the second electroformed member 6 is ground to form the bearing as the second electroformed component. Subsequently, in the same way as the steps depicted in FIGS. 21 and 22, the gear and the bearing are separated and individually taken out.

As described above, according to the method of manufacturing electroformed components of the present invention, the gear and the bearing may be accurately manufactured concurrently in a series of steps. As a result, the gear shaft may be held by the bearing without a gap or causing rattle. According to the method of manufacturing electroformed components of the present invention, by forming the chamfered portion at the end portion of the gear shaft of the gear, stress may be prevented from locally concentrating at the contact portion between the gear shaft and the bearing so as to reduce wear between the gear shaft and the bearing. As a result, a reduction may be achieved in power consumption of a motor.

(Manufacturing Example of Hand and Pipe)

Figure 55:
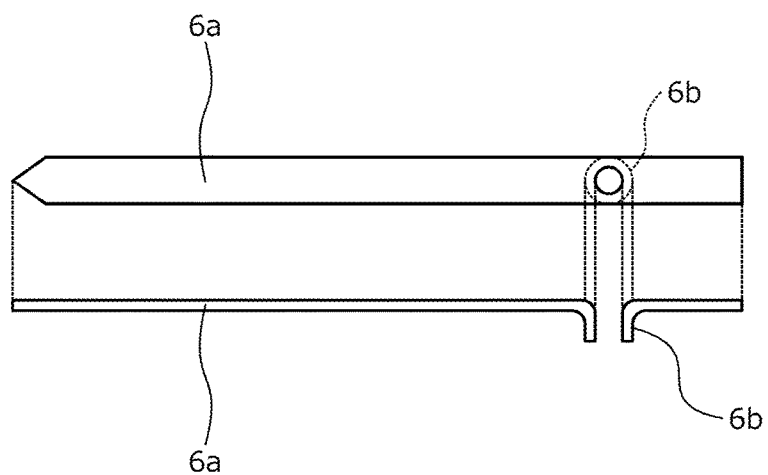
FIG. 55 is an explanatory view of a hand and a pipe incorporated into an analog timepiece.

A manufacturing example of a hand and a pipe incorporated in an analog timepiece will be described. FIG. 55 is an explanatory view of a hand and a pipe incorporated into an analog timepiece. As depicted in FIG. 55, the analog timepiece includes a hand (an indicating hand) 6a representing a time by indicating a number or a scale of a dial, such as an hour hand, a minute hand, and a second hand, for example. The hand 6a may have a tubular pipe 6b provided for a purpose of stably fixing the hand 6a to a shaft of a gear, etc. The pipe 6b has a tubular shape with an axial direction defined in a direction orthogonal to the length direction of the hand 6a and the rotational plane on which the hand rotates. The hand 6a and the pipe 6b are integrally formed.

When the hand 6a and the pipe 6b are manufactured by the manufacturing method of an electroformed component according to the present invention, the second electroformed component is achieved by the hand 6a and the pipe 6b. For example, in the manufacturing of the hand 6a and the pipe 6b according to the method of manufacturing electroformed components of the present invention, first, in the same way as the steps depicted in FIGS. 1 to 4 and 6 to 8 described above, the first electroformed components 4A, 4B are formed to form the second electroforming mold 8.

A film for separation is then provided on the outer surfaces of the first electroformed components 4A, 4B, and, subsequently, the same steps as those described in the first and second embodiments described above are executed. For example, as depicted in FIG. 9, electroforming is performed using the conductive layer 2 as one of electrodes until the second electroformed member 6 is formed having such a thickness allowing the member to somewhat project and rise from the surface of the second photoresist layer 5. After the second electroformed member 6 and the second photoresist layer 5 are planarized as depicted in FIG. 10, the silicon substrate 1 and the conductive layer 2 are removed as depicted in FIG. 11. Subsequently, after the second photoresist layer 5 is removed as depicted in FIG. 12, the first electroformed components 4A, 4B as well as the hand 6a and the pipe 6b, which are the second electroformed components are taken out individually as depicted in FIG. 13.

As described above, according to the method of manufacturing electroformed components of the present invention, the hand 6a and the pipe 6b may be accurately manufactured concurrently in a series of steps.

In the manufacturing of the hand 6a and the pipe 6b, a chamfered portion may be formed by chamfering (rounding) a boundary portion between the hand 6a and the pipe 6b. In this case, after forming the first electroformed components 4A, 4B, corners of the first electroformed components 4A, 4B are chamfered (rounded) to form a chamfered portion 4a on the first electroformed components 4A, 4B. The chamfered portion 4a is formed by chamfering a corner of a portion serving as the boundary between the hand 6a and the pipe 6b.

Subsequently, the second electroformed member 6 is deposited. The second electroformed member 6 forms a round shape curved to cover the chamfered portion 4a at a portion facing the chamfered portion 4a of the first electroformed components 4A, 4B. The inner corner of the second electroformed member 6 formed by electroforming and overlapped on the chamfered portion 4a formed on the first electroformed components 4A, 4B corresponds to the boundary portion between the hand 6a and the arm 6b. Because the chamfered portion 4a is transferred, the boundary portion between the hand 6a and the pipe 6b forms a corresponding concave curve.

This makes it possible to form the integrated hand 6a and pipe 6b with a chamfered shape (round shape) provided on the boundary portion between hand 6a and pipe 6b in a series of steps. By achieving the integrated hand 6a and pipe 6b with a chamfered shape (rounded shape) provided on the boundary portion between the hand 6a and the pipe 6b, stress may be prevented from locally concentrating at the boundary portion whereby a gap or rattle may be prevented from occurring between the hand 6a and the pipe 6b. Therefore, the durability of the analog timepiece may be improved.

In the examples described in the embodiments and the manufacturing examples described above, components of a timepiece such as a mechanical timepiece and a quartz-type electronic timepiece are manufactured by the method of manufacturing electroformed components of the embodiments according to the present invention; however, the method of manufacturing electroformed components of the embodiments according to the present invention is not limited to manufacturing of timepiece components. The method of manufacturing electroformed components of the embodiments according to the present invention is applicable to the manufacturing of not only time piece components but also components of cameras, measuring instruments, and other various types of precision equipment.

INDUSTRIAL APPLICABILITY

As described above, the method of manufacturing electroformed components according to the present invention is useful for a method of manufacturing electroformed components formed by electroforming and incorporated in a timepiece, etc. and is particularly suitable for a method of manufacturing electroformed components used in precision equipment, etc.

EXPLANATIONS OF LETTERS OR NUMERALS 1 silicon substrate
2 conductive layer
3 first photoresist layer
3a opening of first photoresist layer
4 first electroformed member
4a chamfered portion
4A, 4B, 40 first electroformed component
5 second photoresist layer
5a opening of second photoresist layer
6, 55 second electroformed member
6A, 6B, 60 second electroformed component
7, 7' first electroforming mold
8, 8' second electroforming mold
10 metal substrate
15 electroforming tank
16 electrolytic solution
17 counter electrode
18 power source
20 balance wheel (second electroformed component)
20a cutout portion
20b support (support shaft)
25 weight (first electroformed component)
25b center hole
25a cutout portion
30 gear (first electroformed component)
30a tooth
30b annular portion
30c circular opening
30d chamfered portion
35 bearing (second electroformed component)
35a locking hole
35b small diameter portion
35c large diameter portion
35d corner portion
45 flat-plate small component (first electroformed component)
45a chamfered portion
50 escape wheel (second electroformed component)
51 tooth portion
51a thin portion
51c leaving corner
51d locking corner
51e corner portion
6a hand
6b pipe

The invention claimed is:
1. A method of manufacturing electroformed components comprising:
forming a first through-hole by patterning a first photoresist layer formed on a front surface side of a conductive layer, the first through-hole penetrating the first photoresist layer along a stacking direction of the conductive layer and the first photoresist layer;
depositing a first electroformed member on the front surface side of the conductive layer in the first through-hole by electroforming using the conductive layer as one electrode;
forming a first electroformed component by planarizing the front surface side of the first electroformed member and the first photoresist layer;
removing the first photoresist layer from the conductive layer having the first electroformed component formed;
oxidizing a surface of the first electroformed component to form an oxide film on the surface of the first electroformed component, the surface being exposed by the removing of the first photoresist layer, the oxide film facilitating separation of a second electroformed component from the first electroformed component;
forming a second through-hole by forming on the front surface side of the conductive layer, a second photoresist layer covering the first electroformed component from the front surface side and by patterning the second photoresist layer, the second through-hole penetrating the second photoresist layer along the stacking direction while a portion of the first electroformed component projects inward into the second through-hole;
depositing a second electroformed member on the front surface side of the conductive layer in the second through-hole by electroforming using the conductive layer as one electrode;
forming the second electroformed component by planarizing the front surface side of the second electroformed member and the second photoresist layer;
removing the conductive layer from the first electroformed component, the second electroformed component, and the second photoresist layer;
removing the second photoresist layer from the first electroformed component and the second electroformed component having the conductive layer removed;
separating the first electroformed component and the second electroformed component; and
chamfering the first electroformed component at least on a corner of a portion located in the second through-hole, wherein the forming of the oxide film for separation is executed after the chamfering, wherein the chamfering included chamfering the corner by one of electrolytic polishing and wet etching.

2. The method according to claim 1, wherein
the conductive layer is formed on a surface of a substrate containing one of an insulating material and a semiconductive material.

3. The method according to claim 1, wherein
the first electroformed component and the second electroformed component are components at least partially in close contact with or abutting each other.

4. The method according to claim 3, wherein
the first electroformed component and the second electroformed component are components that move relative to each other while at least partially in close contact with or abutting each other.

5. The method according to claim 1, wherein
the forming of the first electroformed component includes planarizing the first electroformed member and the first photoresist layer by grinding from the front surface side.

6. The method according to claim 1, wherein
the forming of the second electroformed component includes planarizing the second electroformed member and the second photoresist layer by grinding from the front surface side.

* * * * *